(12) United States Patent  (10) Patent No.: US 7,075,169 B2
Minami et al. (45) Date of Patent: Jul. 11, 2006

(54) SEMICONDUCTOR DEVICE HAVING A HOLLOW REGION AND METHOD OF MANUFACTURING THE SAME

(75) Inventors: Yoshihiro Minami, Fujisawa (JP); Takashi Yamada, Ebina (JP); Yusuke Kohyama, Poughkeepsie, NY (US); Tsutomu Sato, Poughquag, NY (US); Hajime Nagano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 10/654,030

(22) Filed: Sep. 4, 2003

(65) Prior Publication Data

US 2004/0124439 A1 Jul. 1, 2004

(30) Foreign Application Priority Data

Sep. 4, 2002 (JP) ............................. 2002-259195

(51) Int. Cl.
*H01L 29/72* (2006.01)
(52) U.S. Cl. ....................... 257/622; 257/410
(58) Field of Classification Search ................ 257/622, 257/410
See application file for complete search history.

(56) References Cited

U.S. PATENT DOCUMENTS

| 5,554,870 A | * | 9/1996 | Fitch et al. .................. 257/334 |
| 5,654,573 A | * | 8/1997 | Oashi et al. ................. 257/349 |
| 6,118,164 A | | 9/2000 | Seefeldt et al. |
| 6,277,703 B1 | | 8/2001 | Barlocchi et al. |
| 6,380,010 B1 | * | 4/2002 | Brigham et al. ............. 438/161 |
| 6,531,754 B1 | | 3/2003 | Nagano et al. |
| 6,570,217 B1 | | 5/2003 | Sato et al. |
| 6,630,714 B1 | | 10/2003 | Sato et al. |
| 6,642,115 B1 | * | 11/2003 | Cohen et al. ................ 438/283 |
| 6,670,675 B1 | * | 12/2003 | Ho et al. ..................... 257/347 |
| 2004/0124439 A1 | | 7/2004 | Minami et al. |

FOREIGN PATENT DOCUMENTS

| JP | 10-321802 | 12/1998 |
| JP | 2000-12858 | 1/2000 |
| JP | 2000-35609 | 2/2000 |
| JP | 2003-31687 | 1/2003 |

OTHER PUBLICATIONS

T. Sato, et al., International Electron Devices Meeting, pp. 517-520, "A New Substrate Engineering for the Formation of Empty Space in Silicon (ESS) Induced by Silicon Surface Migration", Dec. 5-8, 1999.

T. Sato, et al., International Electron Devices Meeting, pp. 809-812, "SON (Silicon on Nothing) MOSFET Using ESS (Empty Space in Silicon) Technique for SoC Applications", Dec. 2-5, 2001.

(Continued)

*Primary Examiner*—Edward Wojciechowicz
(74) *Attorney, Agent, or Firm*—Oblon, Spivak, McClelland, Maier & Neustadt, P.C.

(57) ABSTRACT

A hollow region is formed in a silicon substrate. A plurality of openings formed in the silicon layer on the hollow region is filled with a buried film. The bottom portion of the hollow region is formed with a plurality of silicon pillars, which support the silicon layer.

4 Claims, 20 Drawing Sheets

OTHER PUBLICATIONS

U.S. Appl. No. 10/237,206, filed Sep. 9, 2002, Nagano et al.
U.S. Appl. No. 10/407,677, filed Apr. 7, 2003, Nagano et al.
U.S. Appl. No. 10/439,896, filed May 16, 2003, Nagano et al.
U.S. Appl. No. 09/650,748, filed Aug. 30, 2001, Sato et al.
U.S. Appl. No. 09/960,333, filed Sep. 24, 2001, Minami et al.
U.S. Appl. No. 09/995,594, filed Nov. 29, 2001, Yamada et al.
U.S. Appl. No. 10/078,344, filed Feb. 21, 2002, Nagano et al.
U.S. Appl. No. 10/096,655, filed Mar. 14, 2002, Yamada et al.
U.S. Appl. No. 10/654,030, filed Sep. 4, 2003, Minami et al.
U.S. Appl. No. 10/665,614, filed Sep. 19, 2003, Inoh et al.
U.S. Appl. No. 10/654,030, filed Sep. 4, 2003, Minami et al.
U.S. Appl. No. 11/097,166, filed Apr. 4, 2005, Yamada.

* cited by examiner

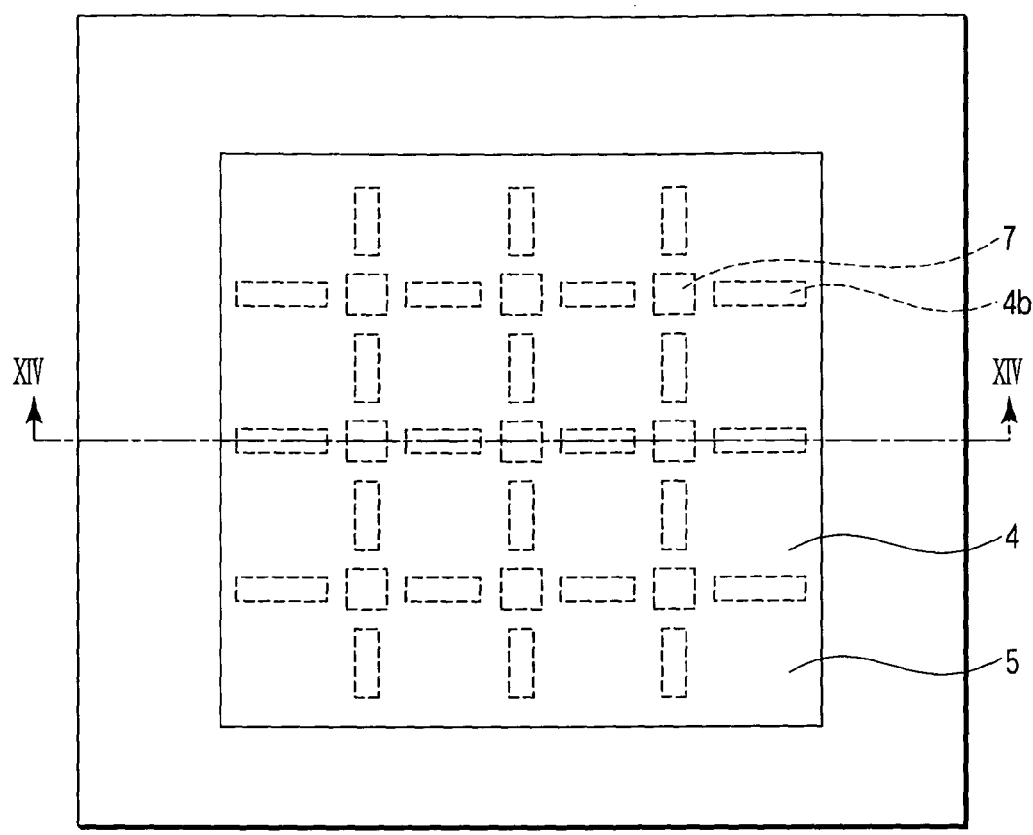
F I G. 13
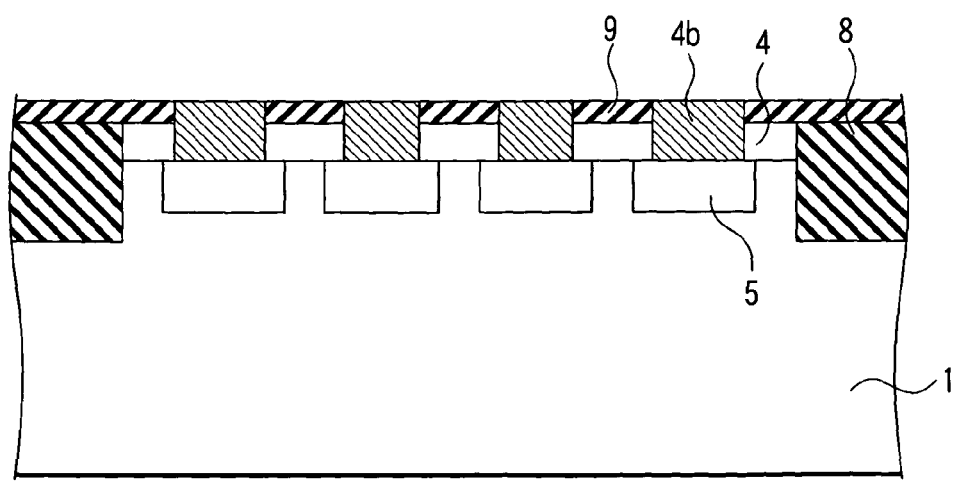
F I G. 14

Logic circuit section 32 | Analog circuit section 31

SEMICONDUCTOR DEVICE HAVING A HOLLOW REGION AND METHOD OF MANUFACTURING THE SAME

CROSS-REFERENCE TO RELATED APPLICATIONS

This application is based upon and claims the benefit of priority from the prior Japanese Patent Application No. 2002-259195, filed Sep. 4, 2002, the entire contents of which are incorporated herein by reference.

BACKGROUND OF THE INVENTION

1. Field of the Invention

The present invention relates to a semiconductor device using a hollow region and a porous silicon layer, and to a method of manufacturing the same.

2. Description of the Related Art

A device using an SON (Silicon On Nothing) structure has been proposed in order to improve semiconductor device performance. The device operation is now being inspected using a μm-order single SON structure. Thus, in order to realize practical use as large-scale integrated circuit (LSI), the μm-order SON structure must be arranged and formed vertically and horizontally.

A method using hydrogen annealing is give as the method of forming a micro SON structure (T. Sato "A New Substrate Engineering for the Formation of Empty Space in Silicon (ESS) Induced by Silicon Surface Migration" "IEDM: International Electron Devices Meeting" 1999 TECHNICAL DIGEST, p. 517–520, T. Sato "SON (Silicon on Nothing) MOSFET using ESS (Empty Space in Silicon) technique for SoC applications" "IEDM: International Electron Devices Meeting" 2001 TECHNICAL DIGEST, p. 809–812). According to the method, the surface of a substrate having trench is formed with a silicon layer by hydrogen annealing. The silicon layer thus formed closes the upper portion of the trench so that the trench inside has a hollow structure.

However, a large amount of the single SON structures is arranged, and thereby, wasteful regions are formed between elements; as a result, chip area efficiency reduces. For this reason, the element having the SON structure must be formed into a large scale. However, it is difficult to form practical and large-scale hollow structure; for this reason, it is hard to realize a ULSI using the SON structure.

Recently, a study has been made of the so-called system-on-a-chip technique of embedding several systems in one chip to achieve downsizing and high performance. However, if a high performance inductor is formed on a silicon substrate, eddy currents generated in the silicon substrate reduce the inductor characteristics. For this reason, it is difficult to form the inductor on a silicon substrate. In addition, if digital and analog circuits are embedded in one chip, there is a problem that crosstalk occurs between these circuits. In addition, when forming a partial SOI substrate in which an SOI (silicon On Insulator) region is formed at part of the substrate, the shape of the boundary region between the SOI region and bulk region is not preferable. As a result, there is a problem that trouble occurs in the process after that. Therefore, it is desired to develop a semiconductor device, which can form an element having a large-scale hollow region suitable to a system on a chip, and a method of manufacturing the same.

BRIEF SUMMARY OF THE INVENTION

According to an aspect of the invention, there is provided a semiconductor device comprising: a hollow region formed in a silicon substrate; a plurality of openings formed in a silicon layer on the hollow region; a buried film buried in the opening; and a plurality of silicon pillars formed at the bottom of the hollow region, and supporting the silicon layer except for the buried film.

According to another aspect of the invention, there is provided a method of manufacturing a semiconductor device, comprising: selectively forming an insulating film on the surface of a silicon substrate to correspond to a region formed as a silicon pillar; forming a porous silicon layer on the surface region of the silicon substrate by anodization using the insulating film as a mask; forming a silicon layer on the substrate formed with the porous silicon layer by epitaxial growth; forming an opening for exposing the porous silicon layer in the silicon layer on the porous silicon layer; removing the porous silicon layer via the opening, and thereby, forming a hollow region and a silicon pillar in the silicon substrate under the silicon layer; and closing the opening with a buried film.

According to a further aspect of the invention, there is provided a semiconductor device comprising: a hollow region formed in a silicon substrate; an opening formed in a silicon layer on the hollow region; a buried film buried in the opening; an insulating film formed on the silicon layer; and an inductor formed on the insulating film corresponding to the hollow region.

According to a still another aspect of the invention, there is provided a method of manufacturing a semiconductor device, comprising: selectively forming a first insulating film on the surface of a silicon substrate; forming a first porous silicon layer on the surface region of the silicon substrate by anodization using the first insulating film as a mask; forming a silicon layer on the substrate formed with the first porous silicon layer by epitaxial growth; forming a second insulating film for exposing part of the silicon layer on the first porous silicon layer; forming a second porous silicon layer connected with the first porous silicon layer in the silicon layer by anodization; removing the first and second porous silicon layers by etching so that an opening is formed in the silicon layer, while forming a hollow region communicating with the opening in the silicon substrate; closing the opening with a buried film; forming an insulating film on the silicon layer; and forming an inductor on the insulating film corresponding to the hollow region.

According to another aspect of the invention, there is provided a semiconductor device comprising: a silicon layer formed on the surface of a silicon substrate; a source/drain region of a MOS transistor formed in the silicon layer and a body between the source/drain region; a porous silicon layer formed in the silicon layer under the body; and a hollow region formed in the silicon layer under the source/drain region.

According to further aspect of the invention, there is provided a method of manufacturing a semiconductor device, comprising: forming a porous silicon layer on the surface of a silicon substrate by anodization; forming a silicon layer on the porous silicon layer by epitaxial growth; etching the porous silicon layer via an opening formed in the silicon layer so that a hollow region can be formed under a bottom portion of the silicon layer, the porous silicon layer remaining in part of the bottom portion of the silicon layer; and closing the opening with a buried film, the hollow region being correspondent to a source/drain region of a MOS transistor formed in the silicon layer, and the porous silicon layer being correspondent to a body of the MOS transistor.

According to another aspect of the invention, there is provided a semiconductor device comprising: a silicon layer formed on the surface of a silicon substrate; a source/drain region of a MOS transistor formed in the silicon layer and a body between the source/drain region; a silicon pillar formed in the silicon substrate under the body; and a hollow region formed in the silicon substrate under the source/drain region.

According to further aspect of the invention, there is provided a method of manufacturing a semiconductor device, comprising: selectively forming a porous silicon layer on the surface of a silicon substrate by anodization; forming a silicon layer on the surface of the silicon substrate and the porous silicon layer by epitaxial growth; etching the porous silicon layer via an opening formed in the silicon layer corresponding to the porous silicon layer so that a hollow region and a silicon pillar can be formed under a bottom portion of the silicon layer; and closing the opening with a buried film, the hollow region being correspondent to a source/drain region of a MOS transistor formed in the silicon layer, and the silicon pillar being correspondent to a body of the MOS transistor.

According to another aspect of the invention, there is provided a semiconductor device comprising: a porous silicon layer formed in a silicon substrate; a silicon layer formed on the porous silicon layer; and an insulating film formed in the silicon layer to contact with the porous silicon layer, and isolating an analog circuit section and a logic circuit section.

According to further aspect of the invention, there is provided a method of manufacturing a semiconductor device, comprising: forming a porous silicon layer on the surface of a silicon substrate by anodization; forming a silicon layer on the porous silicon layer by epitaxial growth; and forming an insulating film, which contacts with the porous silicon layer and isolates an analog circuit section and a logic circuit section, in the silicon layer.

According to another aspect of the invention, there is provided a semiconductor device comprising: a silicon substrate having an analog circuit section and a logic circuit section; a first isolation region formed between the analog circuit section and the logic circuit section, and having a first depth isolating the analog circuit section and the logic circuit section; and a plurality of second isolation regions formed in the analog circuit section and the logic circuit section, and having a second depth shallower than the first depth, the second isolating regions being isolate the analog circuit section itself and isolate the logic circuit section itself.

According to further aspect of the invention, there is provided a method of manufacturing a semiconductor device, comprising: forming a porous silicon layer having a first depth in a silicon substrate positioned between an analog circuit section and a logic circuit section by anodization; etching the porous silicon layer so that a first trench having a first depth can be formed; filling the first trench with a first insulating film so that a first element isolation film can be formed; forming a second trench shallower than the first depth in each silicon substrate corresponding to the analog circuit section and the logic circuit section; and filling the second trench with a second insulating film so that a second element isolation film can be formed.

BRIEF DESCRIPTION OF THE SEVERAL VIEWS OF THE DRAWING

FIG. 13 is a plan view showing a semiconductor device according to a third embodiment of the present invention;

FIG. 14 is a cross-sectional view taken along a line XIV—XIV of FIG. 13;

DETAILED DESCRIPTION OF THE INVENTION

Figure 1:
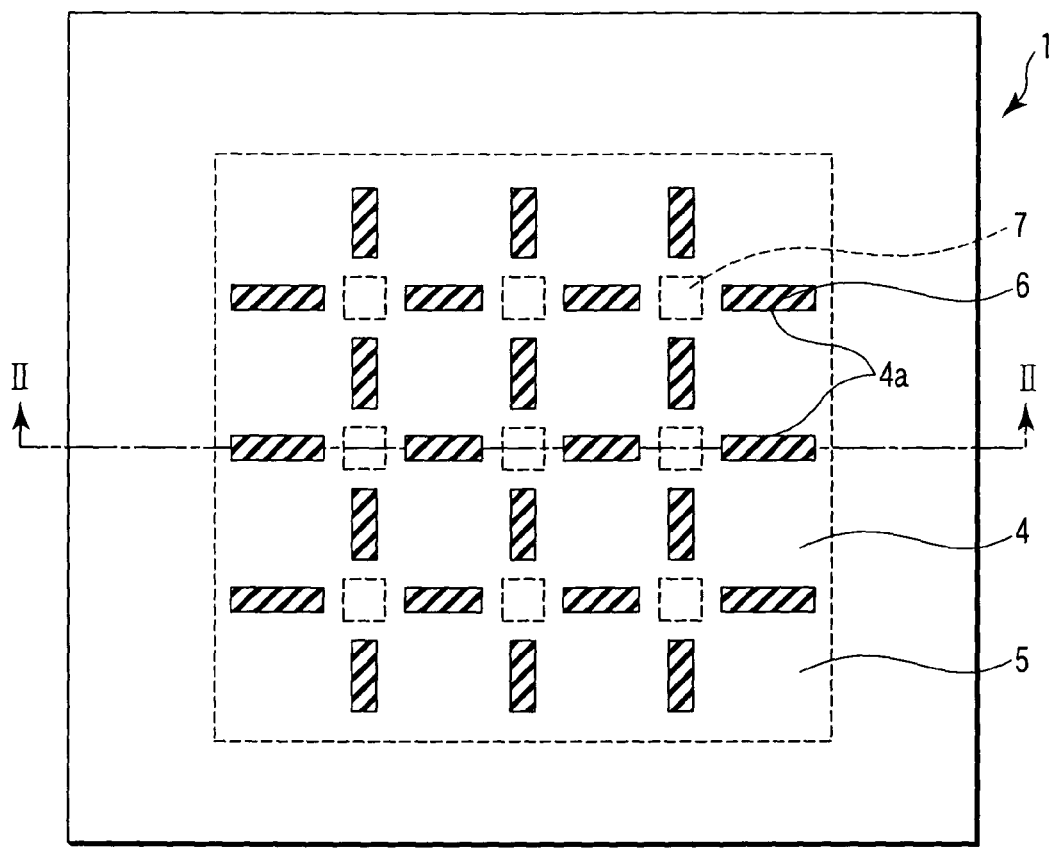
FIG. 1 is a plan view showing a semiconductor device according to a first embodiment of the present invention.

Embodiments of the present invention will be described below with reference to the accompanying drawings. In each embodiment, the same reference numerals are used to designate the identical portions.

(First Embodiment)

Figure 2:
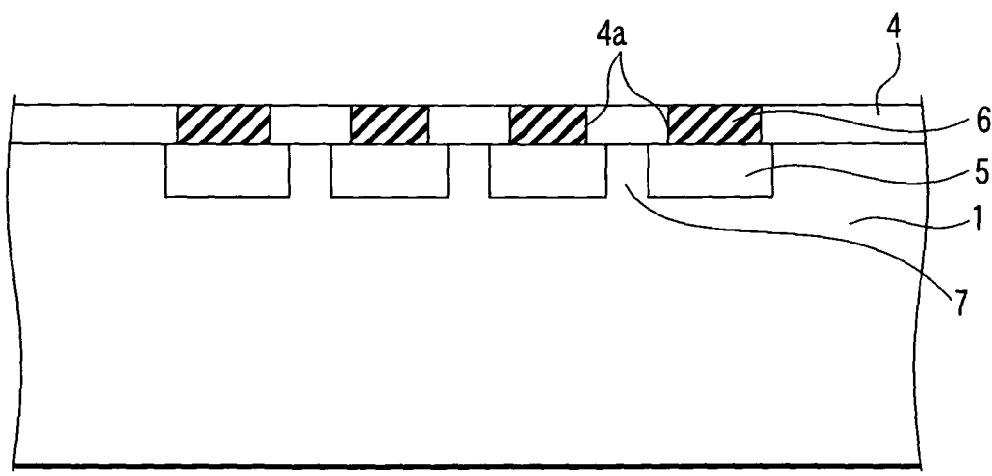
FIG. 2 is a cross-sectional view taken along a line II—II of FIG. 1.

FIG. 1 and FIG. 2 show the first embodiment of the present invention. FIG. 1 is a plan view, and FIG. 2 is a cross-sectional view taken along a line II—II of FIG. 1.

In FIG. 1 and FIG. 2, a hollow region 5 is formed in a silicon substrate 1. A silicon layer 4 is formed on the hollow region 5. The hollow region 5 and the silicon layer 4 form a large-scale SON structure. The silicon layer 4 is formed with a plurality of openings 4a. The opening 4a is filled with a buried film 6 comprising an insulating film. It is desirable that the surface area of the openings 4a and the buried film 6 is made small as much as possible in order to increase element effective area. In addition, a silicon pillar 7 if formed below the silicon layer 4 except for the buried film 6. The silicon pillar 7 extends from the bottom of the hollow region 5 to support the silicon layer 4.

Elements such as several transistors can be formed in the silicon layer 4 surrounded by a plurality of buried films 6. Thus, it is possible to form an element having SON structure.

Figure 3:
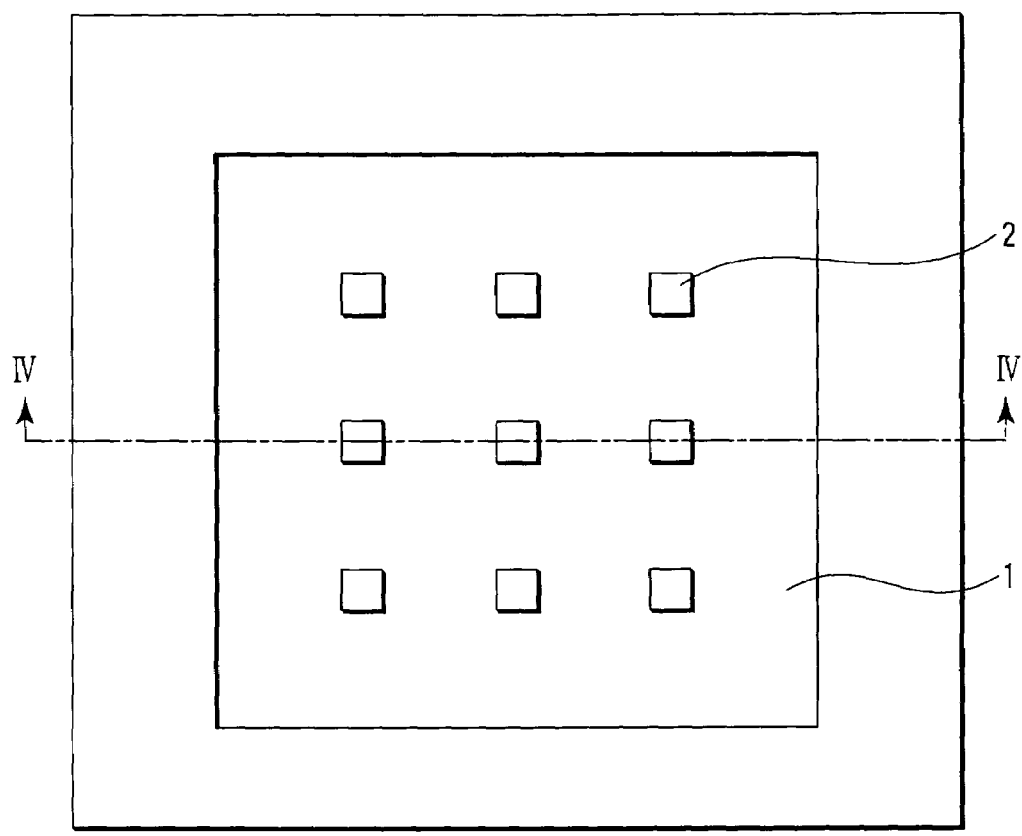
FIG. 3 is a plan view to explain a method of manufacturing the semiconductor device according to the first embodiment of the present invention.
Figure 4:
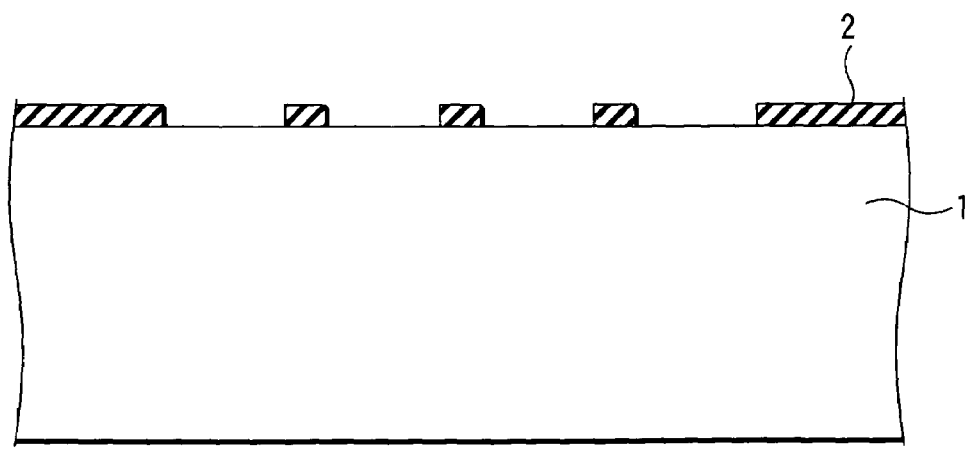
FIG. 4 is a cross-sectional view taken along a line IV—IV of FIG. 3.

FIG. 3 to FIG. 8 shows a method of manufacturing the semiconductor device according to the first embodiment. FIG. 3 shows the first patterning process for forming a large-scale SON structure. FIG. 4 is a cross-sectional view taken along a line IV—IV of FIG. 3.

As shown in FIG. 3 and FIG. 4, an insulating film 2 is formed on the silicon substrate 1, and thereafter, the insulating film 2 is patterned. In the insulating film 2, portions corresponding to the hollow region 5 are removed; on the other hand, portions corresponding to the silicon pillar 4 and the peripheral edge of the hollow region are left. For example, resist film, silicon oxide film and silicon nitride film may be used as the insulating film 2.

Anodization is carried out so that a porous silicon layer can be formed on the silicon surface. More specifically, when current is applied using the silicon substrate 1 as the anode in HF solution containing ethanol, current flows through only portions formed with no insulating film 2. Thus, the surface of the silicon substrate 1 is formed with micro holes having a diameter of several nm, and thereafter, the micro holes extend into the substrate. In this manner, a porous silicon layer is selectively formed.

Figure 5:
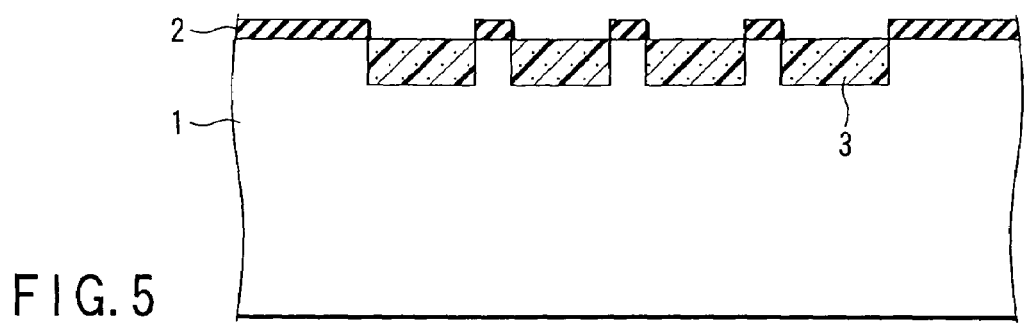
FIG. 5 is a cross-sectional view showing the manufacturing process following FIG. 4.

FIG. 5 shows the state after anodization, a porous silicon layer 3 exposed from the insulating film 2 is formed in the surface region of the silicon substrate 1.

Figure 6:
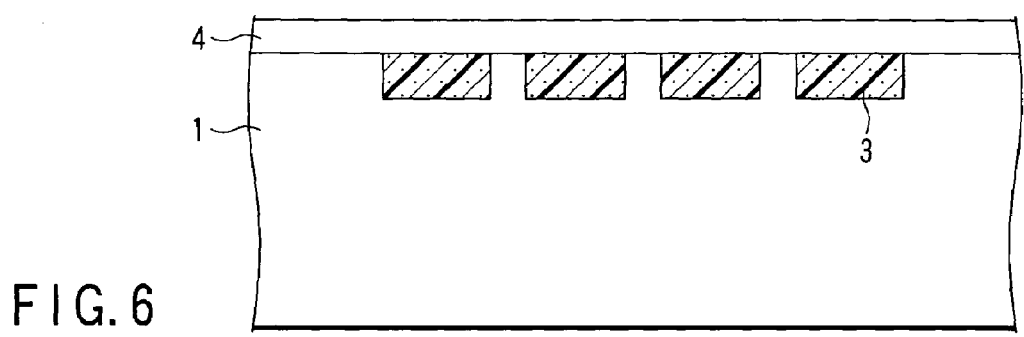
FIG. 6 is a cross-sectional view showing the manufacturing process following FIG. 5.

As illustrated in FIG. 6, the insulating film 2 is removed, and thereafter, a silicon layer 4 is formed on the surface of the silicon substrate 1 by epitaxial growth.

Figure 7:
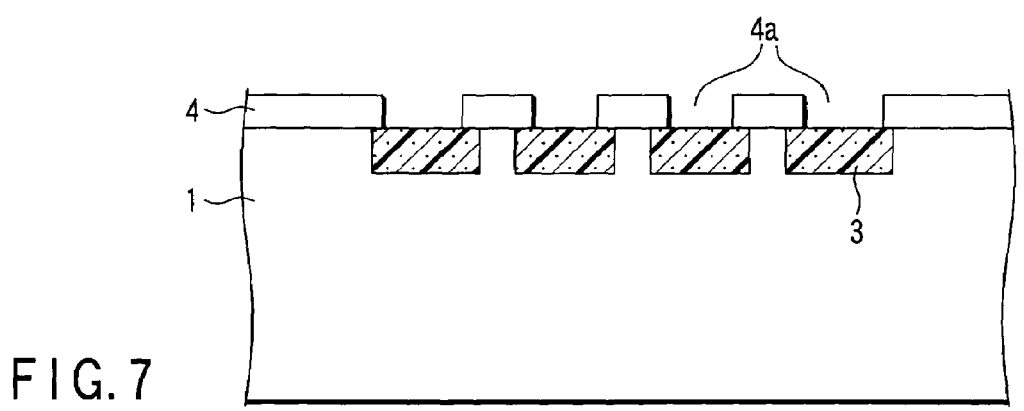
FIG. 7 is a cross-sectional view showing the manufacturing process following FIG. 6.

As depicted in FIG. 7, a mask pattern is formed on the silicon layer 4 by photo resist (not shown). The silicon layer 4 is etched by RIE (Reactive Ion Etching) using the mask pattern so that a plurality of openings 4*a* can be formed. The openings 4*a* are formed on the porous silicon layers 3 other than the silicon substrate 1 so that the porous silicon layer 3 can be exposed.

Thereafter, the silicon substrate 1 is immersed in HF solution, and thereby, the porous silicon layer 3 is selectively etched so that the hollow region 5 can be formed. Namely, the porous silicon layer 3 is etched and removed via the opening 4*a*.

Figure 8:
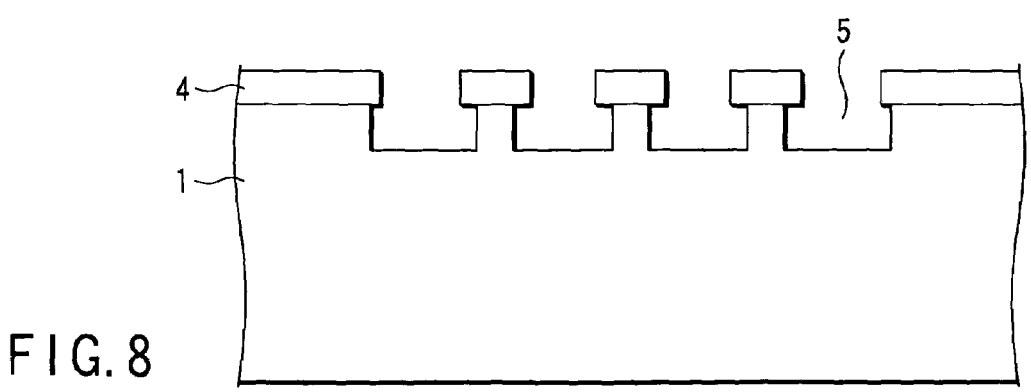
FIG. 8 is a cross-sectional view showing the manufacturing process following FIG. 7.

FIG. 8 shows the state that the porous silicon layer 3 is removed. A region formed with no porous silicon layer 3 is left as the silicon pillar 7 to support the silicon layer 4.

As seen from FIG. 1 and FIG. 2, the opening 4*a* used to etch the porous silicon layer 3 is filled with the buried film 6 so that the opening 4*a* can be closed. The area of the opening 4*a* is very small. Thus, a film is deposited using LPCVD (low Pressure Chemical Vapor Deposition), and thereby, the opening 4*a* can be readily closed. The film (not shown) adheres to the inner wall of the hollow region 5. However, the adhered film is a slight amount; therefore, the hollow region 5 is not filled with the film.

After the buried film 6 is deposited, the entire surface is planarized by CMP (Chemical Mechanical polishing), and thereby, a large-scale SON structure is completed.

In the actual manufacture of LSI, isolation region and elements such as transistor are formed in the silicon layer 4 after the process described above.

According to the first embodiment, the hollow region 5 is formed in the silicon substrate 1, and the silicon pillar 7 formed at the bottom of the hollow region 5 supports the silicon layer 4. Thus, a large-scale SON structure can be formed.

In addition, according to the SON structure, it is possible to sufficiently make small the surface area of the opening 4*a* used for removing the porous silicon layer 3 and the buried film 6 filled in the opening 4*a*. Therefore, the generation of wasteful regions is reduced as compared with the case where a plurality of single SON structures is arranged, so that chip effective area can be increased.

(Second Embodiment)

FIG. 9 to FIG. 12 shows the second embodiment of the present invention, that is, another manufacturing method of the first embodiment. The processes from FIG. 3 to FIG. 6 of the first embodiment are the same as the second embodiment; therefore, the explanation is omitted.

Figure 9:
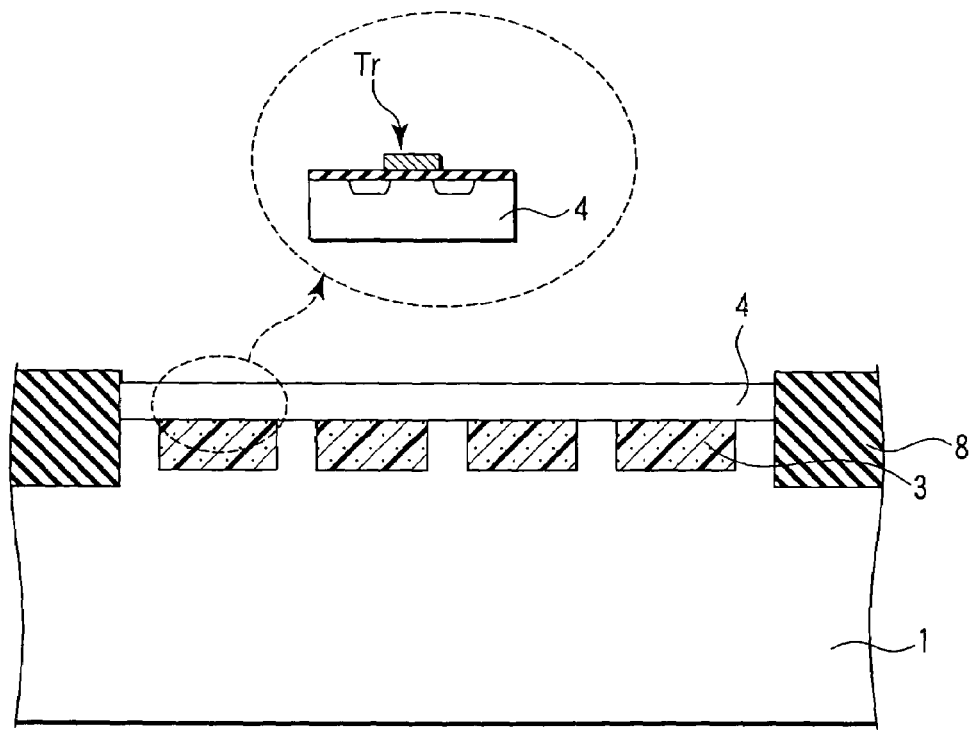
FIG. 9 shows a second embodiment of the present invention, and is a cross-sectional view to explain another method of manufacturing the semiconductor device according to the first embodiment.

In FIG. 9, a STI (Shallow Trench Isolation) 8 is formed as an isolation region in the silicon layer 4 and the silicon substrate 1. More specifically, a trench is formed in the silicon layer 4 and the silicon substrate 1, and thereafter, filled with an insulating film, and thereby, the STI 8 is formed.

Thereafter, a transistor Tr is formed in the silicon layer 4. More specifically, a gate insulating film is formed on the silicon layer 4, and a gate electrode is formed on the gate insulating film. A diffusion layer is formed as a source/drain layer in the silicon layer 4.

Figure 10:
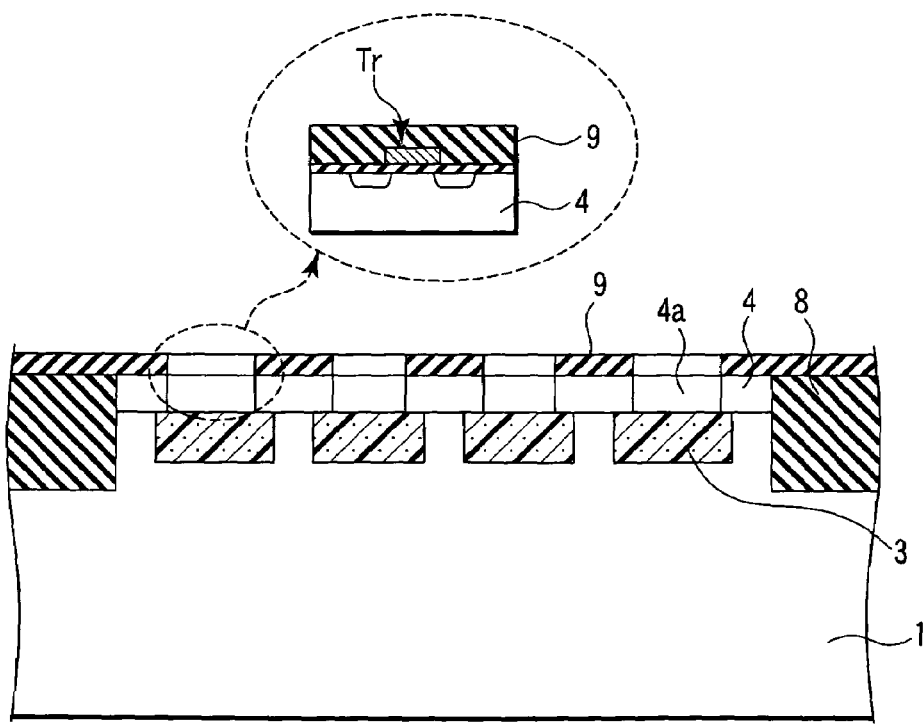
FIG. 10 is a cross-sectional view showing the manufacturing process following FIG. 9.

After the element formation process described above is carried out, a protection film 9 for protecting the element is deposited on the silicon layer 4, as illustrated in FIG. 10. For example, a silicon nitride film is used as the protection film 9. Thereafter, a plurality of openings 4*a* is formed in the silicon layer 4 and the protection film 9 on the porous silicon layer 3 except for the regions formed with the element.

Figure 11:
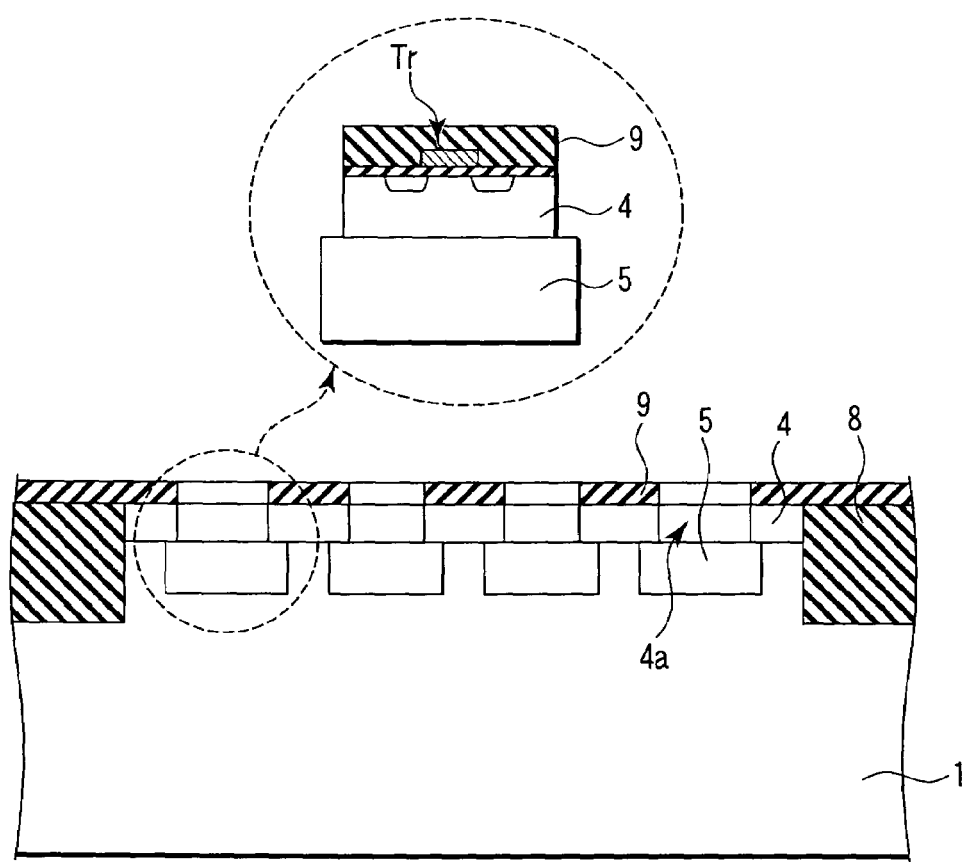
FIG. 11 is a cross-sectional view showing the manufacturing process following FIG. 10.
Figure 12:
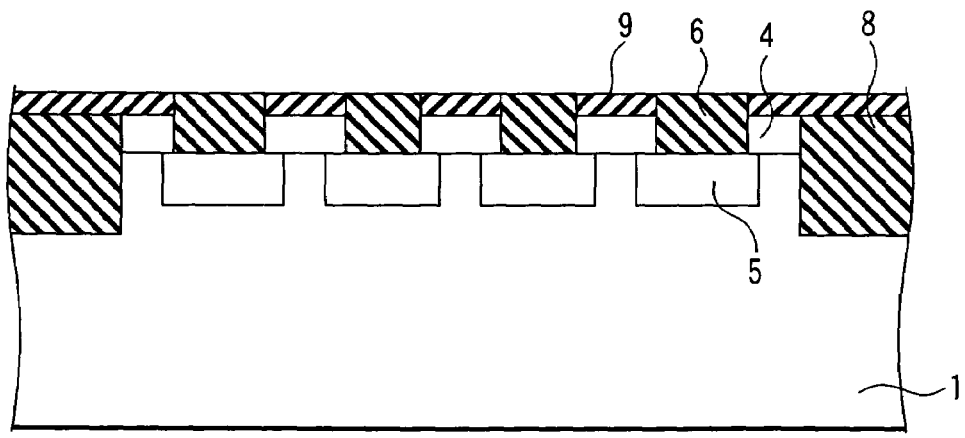
FIG. 12 is a cross-sectional view showing the manufacturing process following FIG. 11.

As depicted in FIG. 11, the porous silicon layer 3 is removed by etching via the openings in the manner described before. Thus, the hollow region 5 is formed under the silicon layer 4. Thereafter, the buried film 6 is deposited on the protection film 9 to close the opening 4*a*, like the first embodiment.

According to the second embodiment, element formation process requiring high temperature heat treatment is carried out before forming the SON structure. Therefore, it is possible to reduce the influence of stress by high temperature to the SON structure.

(Third Embodiment)

FIG. 13 and FIG. 14 show a semiconductor device according to the third embodiment of the present invention. In the first and second embodiments, the opening 4*a* is filled with the buried film comprising the insulating film. On the contrary, according to the third embodiment, the opening 4*a* is filled with a silicon layer 4*b*. More specifically, the silicon substrate 1 is subjected to heat treatment (hydrogen annealing) in hydrogen gas atmosphere, and thereby, the opening 4*a* is filled with the silicon layer 4*b*.

According to the third embodiment, the opening 4*a* is filled with the silicon layer 4*b*, so that the effective area of the silicon layer 4 can be enlarged. As a result, the element region can be widened.

(Fourth Embodiment)

Figure 15:
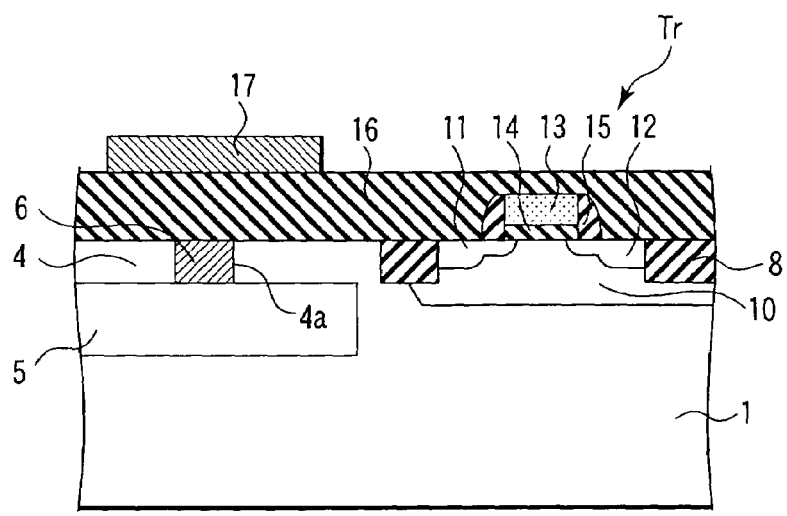
FIG. 15 is a cross-sectional view showing a semiconductor device according to a fourth embodiment of the present invention.

FIG. 15 shows a semiconductor device according to the fourth embodiment of the present invention. The fourth embodiment shows one example of system on chip.

In FIG. 15, the hollow region 5 is selectively formed in the silicon substrate 1. The silicon layer 4 is formed above the hollow region 5. The silicon layer 4 is formed with an opening 4*a*, which communicates with the hollow region 5. The buried film 6 is formed in the opening 4*a*, so that the opening can be closed with the buried film 6. An interlayer insulating film 16 is formed above the silicon layer 4, and further, a spiral inductor 17 (plan view is not shown) is formed on the interlayer insulating film 16.

On the other hand, the portion formed with no hollow region 5 has the same structure as a normal bulk substrate, and is formed with a NMOS transistor Tr, for example. More specifically, a P-type layer 10 is formed on the surface region of the silicon substrate 1. The P-type layer 10 is formed with an N-type diffusion layer functioning as source/drain regions 11 and 12 of an N-channel MOS transistor (hereinafter, referred to as NMOS transistor) Tr. A gate electrode 13 is formed on the P-type layer 10 via a gate insulating film 14. Both sides of the gate electrode 13 are formed with a sidewall insulating film 15. The MOS transistor Tr is coated with the interlayer insulating film 16.

FIG. 16 to FIG. 22 shows a method of manufacturing the semiconductor device according to the fourth embodiment.

Figure 16:
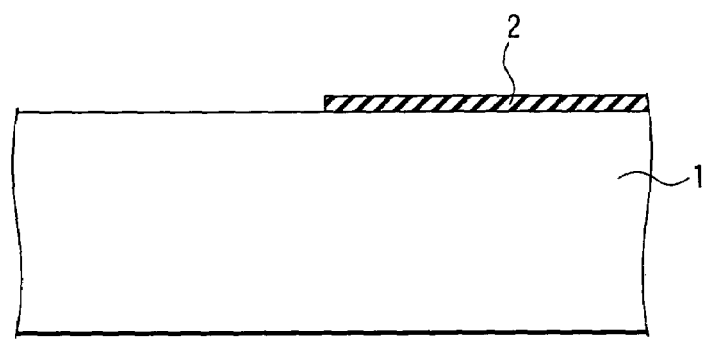
FIG. 16 is a cross-sectional view to explain a method of manufacturing the semiconductor device according to the fourth embodiment of the present invention.

In FIG. 16, an insulating film 2 is selectively formed on the surface of the silicon substrate 1. More specifically, the insulating film 2 is formed except for the region forming the hollow region 5. For example, resist may be used as the insulating film 2. Thereafter, anodization is carried out with respect to the silicon substrate 1. Namely, current is applied using the silicon substrate 1 as the anode in HF+ethanol solution. By doing so, the surface of the silicon substrate 1 is formed with micro holes having a diameter of several nm, and these micro holes extend into there.

Figure 17:
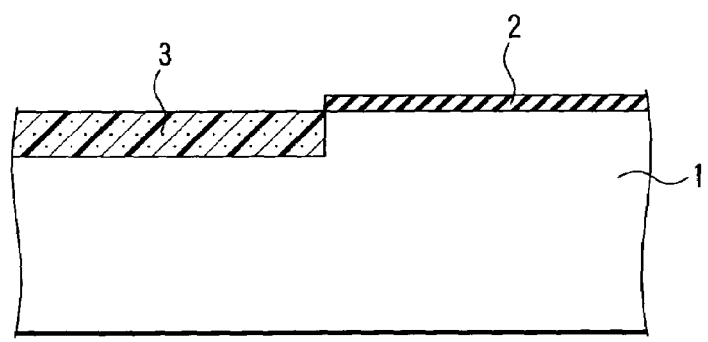
FIG. 17 is a cross-sectional view showing the manufacturing process following FIG. 16.

FIG. 17 shows the state of anodization. Current flows through only portions having no insulating film 2. Thus, a porous silicon layer 3 is selectively formed in the silicon substrate 1 corresponding to the portions having no insulating film 2.

Figure 18:
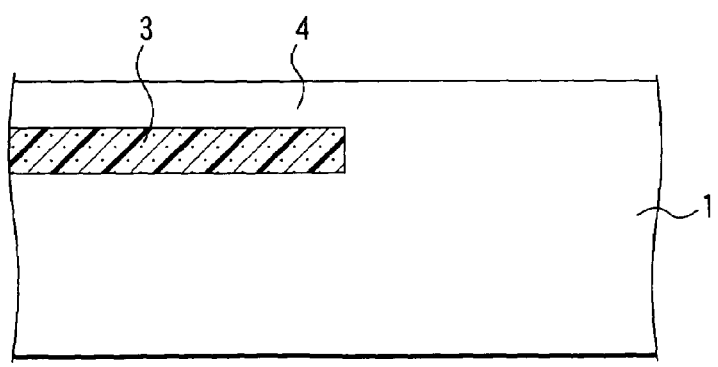
FIG. 18 is a cross-sectional view showing the manufacturing process following FIG. 17.

As seen from FIG. 18, the insulating film 2 is removed, and the surface of the silicon substrate 1 is formed with a silicon layer 4 by epitaxial growth.

Figure 19:
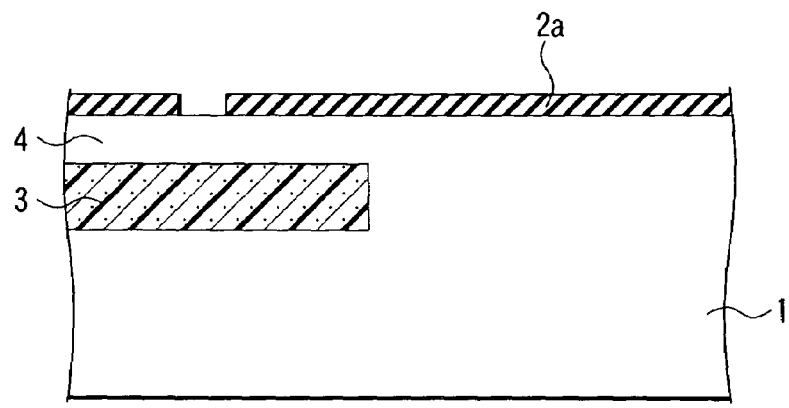
FIG. 19 is a cross-sectional view showing the manufacturing process following FIG. 18.

As shown in FIG. 19, an insulating film 2a is formed on the silicon layer 4. The portion corresponding to the porous silicon layer 4 in the insulating film 2a is etched so that micro holes exposing the silicon layer 4 can be formed. Anodization is carried out with respect to the foregoing state silicon substrate 1 for proper time.

Figure 20:
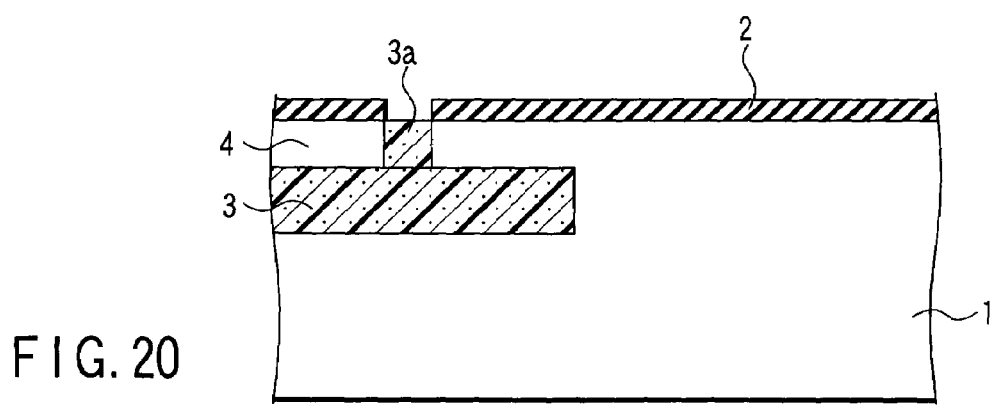
FIG. 20 is a cross-sectional view showing the manufacturing process following FIG. 19.

As illustrated in FIG. 20, a porous silicon layer 3a grows from the surface of the silicon layer 4 to communicate with the previously formed porous silicon layer 3. Thereafter, the silicon substrate 1 is etched using HF solution.

Figure 21:
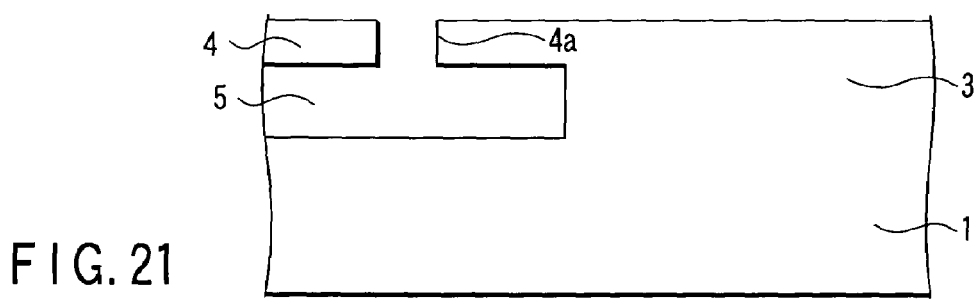
FIG. 21 is a cross-sectional view showing the manufacturing process following FIG. 20.

As depicted in FIG. 21, the porous silicon layers 3 and 3a are etched according to the difference between etching rate to silicon, and thereby, the hollowing region 5 and the opening 4a communicating with there are formed.

Figure 22:
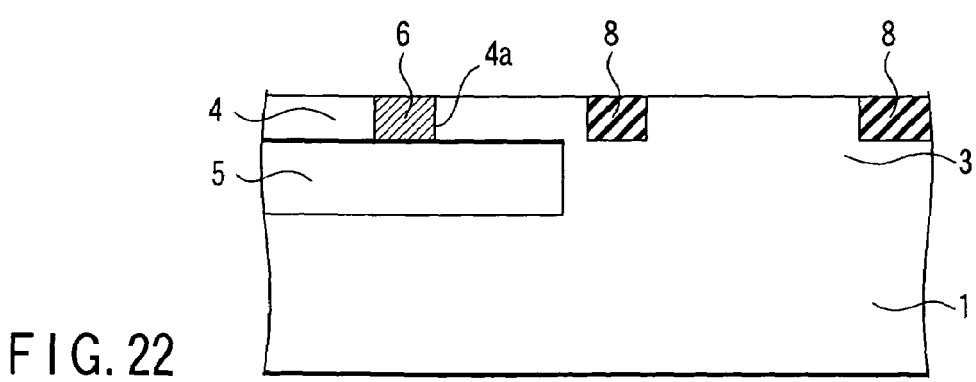
FIG. 22 is a cross-sectional view showing the manufacturing process following FIG. 21.

The buried film 6 is deposited by LPCVD, and thereby, the opening 4a is closed as shown in FIG. 22. The opening 4a can be readily closed because it is very small. The buried film 6 adheres to the inner wall of the hollow region 5 although not illustrated. However, the adhering buried film 6 is a slight amount; therefore, there is no influence. Thereafter, a STI 8 used as an element isolation region is formed in necessary regions on the substrate by normal STI process.

Thereafter, the P-type layer 10 and the MOS transistor Tr are formed in the element region surrounded by the STI 8 by normal semiconductor process, and the inductor 17 is formed on the interlayer insulating film 16, as shown in FIG. 15.

In FIG. 15, the NMOS transistor is formed in the element region. In this case, the transistor is not limited to the NMOS transistor, and a P-channel MOS transistor and other semiconductor elements may be formed.

According to the fourth embodiment, the hollow region 5 is formed below the spiral inductor 17. Thus, this serves to prevent the generation of eddy current in the silicon substrate 1. As a result, it is possible to improve the characteristic of the inductor 17.

In addition, the porous silicon layer 3 is formed in the silicon substrate 1 by anodization, and the silicon layer 4 is formed with the porous silicon layer 3a communicating with the porous silicon layer 3. The porous silicon layers 3 and 3a are etched, and thereby, the hollow region 5 is formed. Therefore, it is possible to readily form a large hollow region 5 in the silicon substrate 1.

(Fifth Embodiment)

Figure 23:
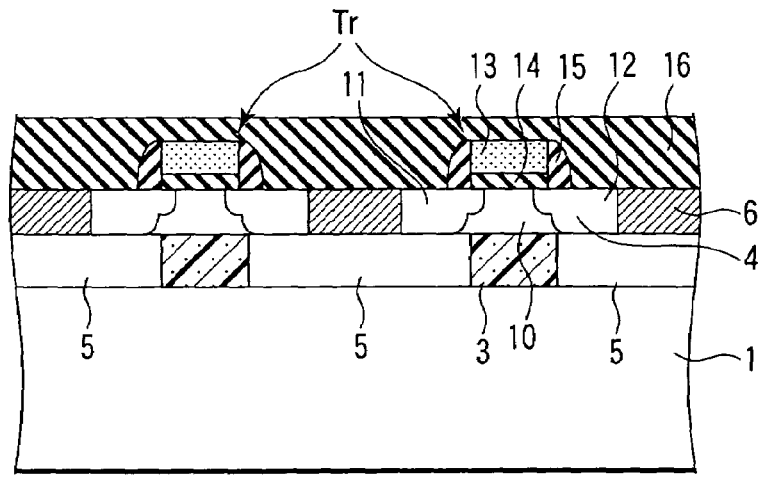
FIG. 23 is a cross-sectional view showing a semiconductor device according to a fifth embodiment of the present invention.

FIG. 23 shows a semiconductor device according to the fifth embodiment of the present invention. The fifth embodiment shows the device having SON structure.

In FIG. 23, the porous silicon layer 3 is selectively formed in the silicon substrate 1, and the hollow region 5 is formed adjacent to the porous silicon layer 3. The silicon layer 4 is formed on the porous silicon layer 3 and the hollow region 5, and the NMOS transistor Tr is formed in the silicon layer 4. In other words, an N-type diffusion layer functioning as source/drain regions 11 and 12 of the transistor Tr is formed therein. The buried film 6 is formed in the silicon layer 4 adjacent to the transistor Tr. The porous silicon layer 3 contacts with a P-type body 10 of the NMOS transistor Tr; on the other hand, the hollow region 5 contacts with the bottom portions of the source/drain region 11 and 12.

FIG. 24 to FIG. 27 shows a method of manufacturing the semiconductor device according to the fifth embodiment.

Figure 24:
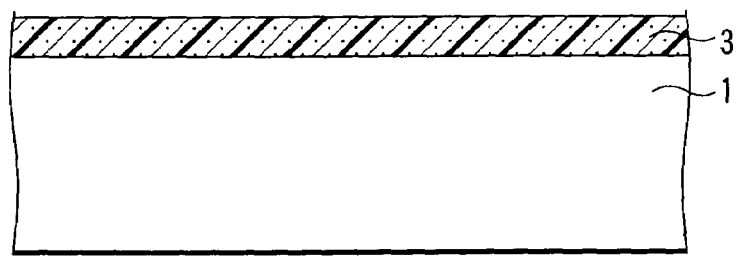
FIG. 24 is a cross-sectional view to explain a method of manufacturing the semiconductor device according to the fifth embodiment of the present invention.

As shown in FIG. 24, the porous silicon layer 3 is formed on the surface of the silicon substrate 1 by anodization.

Figure 25:
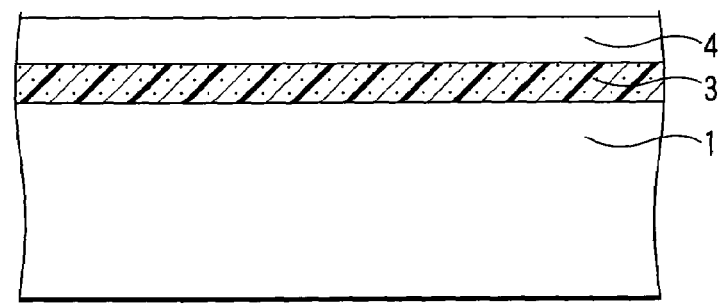
FIG. 25 is a cross-sectional view showing the manufacturing process following FIG. 24.

Thereafter, the silicon layer 4 is formed on the porous silicon layer 3 by epitaxial growth, as seen from FIG. 25.

Figure 26:
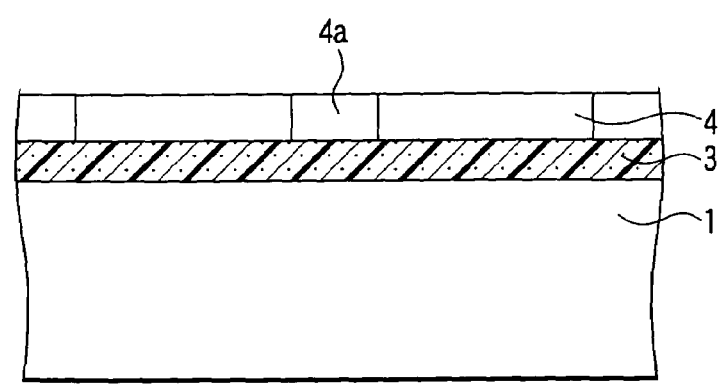
FIG. 26 is a cross-sectional view showing the manufacturing process following FIG. 25.

As illustrated in FIG. 26, the silicon layer 4 is selectively etched by RIE so that the opening 4a can be formed.

Figure 27:
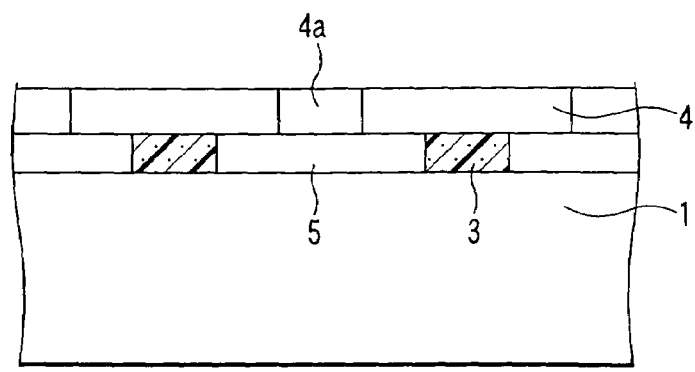
FIG. 27 is a cross-sectional view showing the manufacturing process following FIG. 26.

As depicted in FIG. 27, the porous silicon layer 3 is selectively etched by HF solution. More specifically, etching time is controlled, and thereby, the porous silicon layer 3 is left at the bottom portion of the silicon layer 4, which will function later as a P-type body of transistor.

Thereafter, the opening 4a formed in the silicon layer 4 is filled with the buried film 6, and thus, the structure shown in FIG. 23 is obtained. Then, a MOS transistor is formed by known process.

A series of etching processes for forming the hollow region 5 is not limited to the embodiment described above. For example, the silicon layer 4 is etched by RIE; in this case, the following etching may be carried out. Namely, without using RIE, part of the silicon layer 4 is formed with the porous silicon layer 3a communicating with the porous silicon layer 3 as described in the fourth embodiment. Two porous silicon layers are continuously etched, and thereby, the shape shown in FIG. 27 can be formed.

The silicon layer 4 is formed with a NMOS transistor; in this case, the present invention is not limited to the NMOS transistor. For example, a PMOS transistor or other semiconductor elements may be formed therein. If the PMOS transistor is formed, of course, an N-type body is formed in the silicon layer 4.

According to the fifth embodiment, high-speed operation is possible because no extra parasitic capacitance exists in the source/drain region. In addition, the P-type body contacts with the substrate 1 through the porous silicon layer 3. Therefore, the potential of the P-type body is stable, so that stable operation can be obtained.

(Sixth Embodiment)

Figure 28:
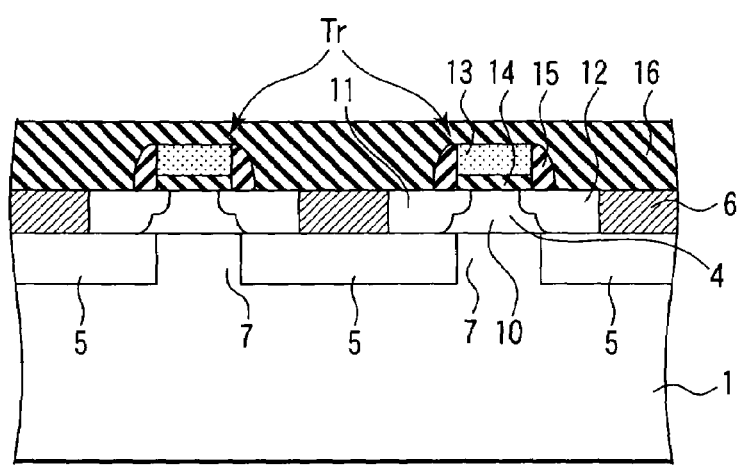
FIG. 28 is a cross-sectional view showing a semiconductor device according to a sixth embodiment of the present invention.

FIG. 28 shows a semiconductor device according to the sixth embodiment of the present invention. The sixth embodiment relates to a modification example of the fifth embodiment. In FIG. 28, points different from FIG. 23 will be described below. In FIG. 23, the porous silicon layer 3 is formed under the P-type body of the NMOS transistor Tr. On the contrary, in FIG. 28, the silicon pillar 7 is formed under the P-type body of the NMOS transistor Tr. In addition, the hollow region 5 is formed under the source/drain regions 11 and 12 of the NMOS transistor Tr.

Figure 29:
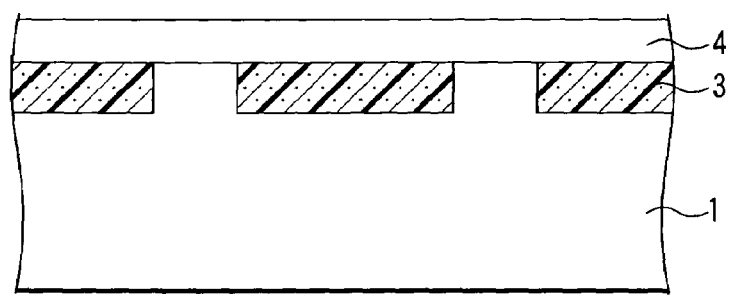
FIG. 29 is a cross-sectional view to explain a method of manufacturing the semiconductor device according to the sixth embodiment of the present invention.
Figure 30:
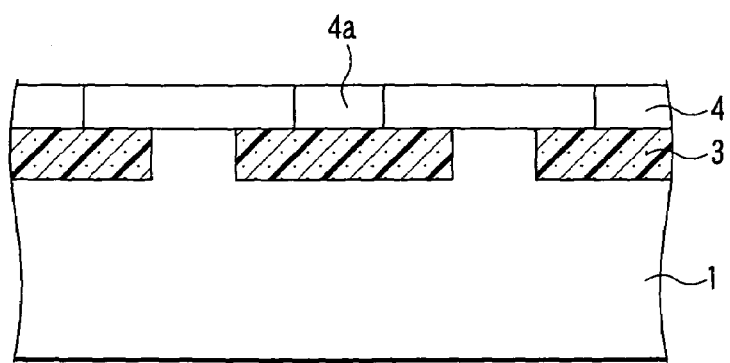
FIG. 30 is a cross-sectional view showing the manufacturing process following FIG. 29.
Figure 31:
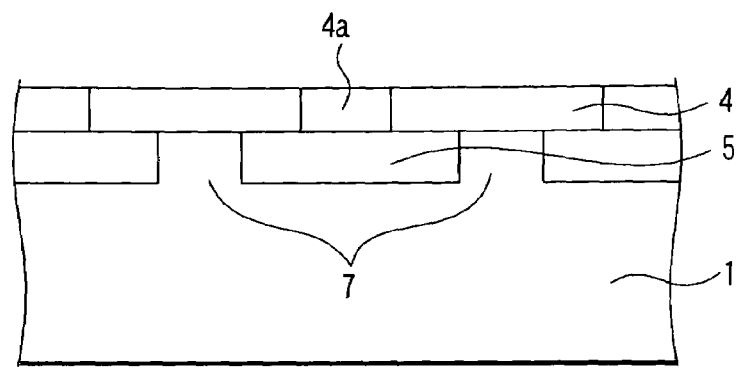
FIG. 31 is a cross-sectional view showing the manufacturing process following FIG. 30.

FIG. 29 to FIG. 31 shows a method of manufacturing the semiconductor device according to the sixth embodiment.

FIG. 29 shows the structure formed according to the manufacturing method described in FIG. 4 to FIG. 6. More specifically, the porous silicon layer 3 is selectively formed in the silicon substrate 1. The silicon layer 4 is formed on the silicon substrate 1 and the porous silicon layer 3 by epitaxial growth.

As shown in FIG. 30, the silicon layer 4 is selectively etched by RIE, and thereby, the opening 4a for exposing the porous silicon layer 3 is formed.

Thereafter, as illustrated in FIG. 31, the porous silicon layer 3 is selectively etched by HF solution so that the hollow region 5 and the silicon pillar 7 can be formed. The silicon pillar 7 is later formed under the P-type body of transistor.

A series of etching processes for forming the hollow region 5 is not limited to the embodiment described above. For example, the silicon layer 4 is etched by RIE; in this case, the following etching may be carried out. Namely, without using RIE, part of the silicon layer 4 is formed with the porous silicon layer 3a communicating with the porous silicon layer 3 as described in the fourth embodiment. Two porous silicon layers are continuously etched, and thereby, the shape shown in FIG. 31 can be formed.

The silicon layer 4 is formed with a PMOS transistor; in this case, the present invention is not limited to the PMOS transistor. For example, a NMOS transistor may be formed therein.

According to the sixth embodiment, the transistor can make a high-speed operation because no extra parasitic capacitance exists in the source/drain region.

In addition, the P-type body 10 contacts with the substrate 1 through a single crystal silicon layer. Therefore, the potential of the P-type body 10 is stabilized, so that the stable transistor operation can be obtained.

(Seventh Embodiment)

Figure 32:
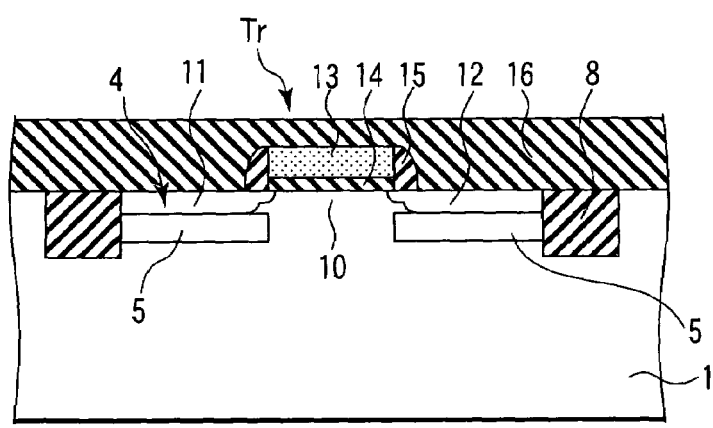
FIG. 32 is a cross-sectional view showing a semiconductor device according to a seventh embodiment of the present invention.

FIG. 32 shows a semiconductor device according to the seventh embodiment of the present invention. The silicon substrate 1 is formed with the STI 8. A very thin silicon layer 4 having a thickness of about 10 to 50 nm is formed in the element region surrounded by the STI 8, that is, in the surface region of the silicon substrate 1. Source/drain regions 11 and 12 of the NMOS transistor Tr are formed in the silicon layer 4. The hollow region 5 is formed in the silicon substrate 1 under each of the source/drain regions 11 and 12. In this case, the hollow region 5 is formed to contact with the STI 8. The silicon substrate 1 situated between the hollow regions 5 contacts with the P-type body situated between the source/drain regions 11 and 12.

According to the seventh embodiment, the hollow region 5 is formed under the source/drain regions 11 and 12. Therefore, almost no extra parasitic capacitance exists in the source/drain regions 11 and 12, so that the MOS transistor can make a high-speed operation.

In addition, the P-type body 10 contacts with the substrate 1 through a single crystal silicon layer. Therefore, the potential of the P-type body 10 is stabilized, so that the MOS transistor can make a stable operation.

(Eighth Embodiment)

Figure 33:
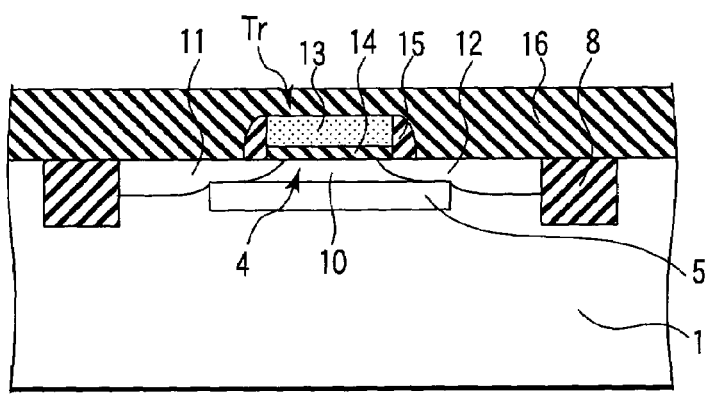
FIG. 33 is a cross-sectional view showing a semiconductor device according to an eighth embodiment of the present invention.

FIG. 33 shows a semiconductor device according to the eighth embodiment of the present invention. FIG. 33 shows a modification example of FIG. 32. In FIG. 32, the hollow region 5 is formed under the source/drain regions 11 and 12. On the contrary, in FIG. 33, the hollow region 5 is formed under the P-type body 10 of the NMOS transistor Tr. Namely, the hollow region 5 is formed at the approximately central portion of the element region separating from the STI 8. Source/drain regions 11 and 12 are formed in the silicon layer 4 and the silicon substrate 1. The silicon layer of the P-type body is very thin, and the thickness is about 10 to 50 nm, for example.

According to the eighth embodiment, a depletion layer in the P-type body 10 contacts with the hollow region 5. Thus, a full depletion MOS transistor can be formed.

In addition, the source/drain regions 11 and 12 are formed in the silicon layer 4 and the silicon substrate 1; therefore, the region is formed thicker. As a result, there is no need of employing elevated source/drain structure, so that the manufacture process can be reduced.

(Ninth Embodiment)

Figure 34:
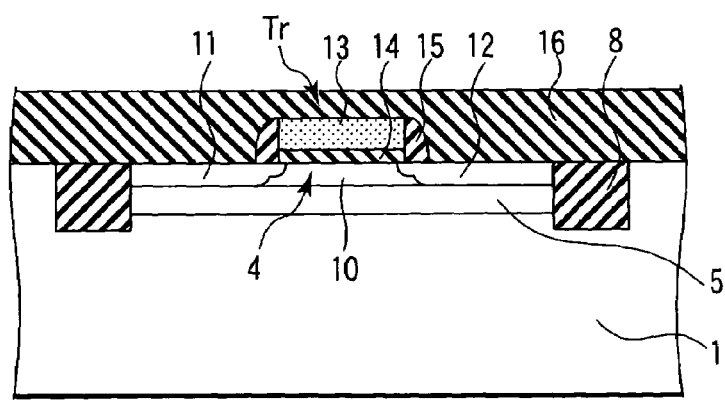
FIG. 34 is a cross-sectional view showing a semiconductor device according to a ninth embodiment of the present invention.

FIG. 34 shows a semiconductor device according to the ninth embodiment of the present invention. FIG. 34 shows a modification example of FIG. 32 and FIG. 33. The hollow region 5 is formed in the element region surrounded by the STI 8, that is, the silicon substrate 1. More specifically, the hollow region 5 is formed over the entire element region. The silicon layer 4 is formed on the upper portion of the hollow region 5. The silicon layer 4 is very thin, and has a thickness of about 10 to 50 nm, for example. The source/drain region and P-type body 10 of the NMOS transistor are formed in the silicon layer 4.

According to the ninth embodiment, a full depletion transistor is formed. Therefore, it is possible to realize high-speed operation and low current consumption.

Figure 35:
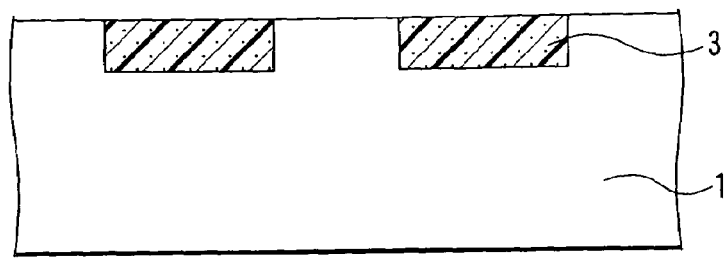
FIG. 35 is a cross-sectional view to explain a method of manufacturing the semiconductor device according to the seventh embodiment of the present invention.
Figure 36:
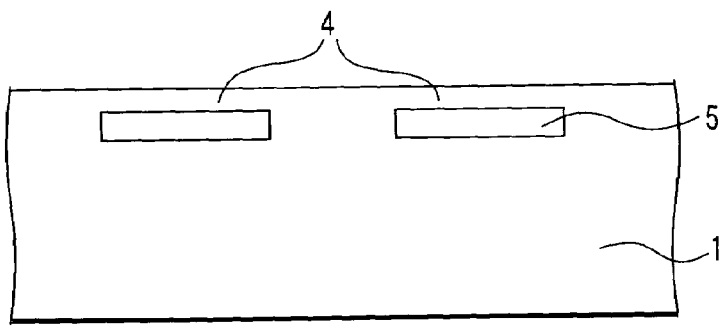
FIG. 36 is a cross-sectional view showing the manufacturing process following FIG. 35.
Figure 37:
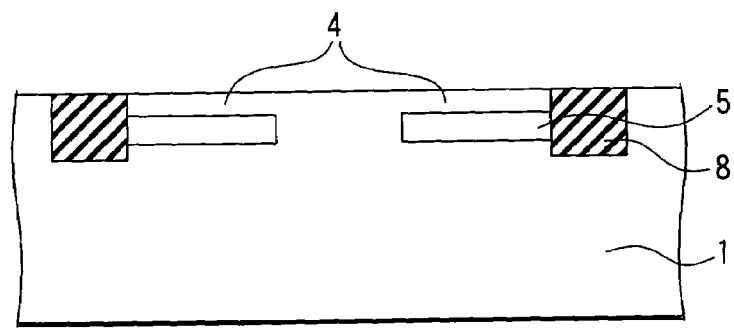
FIG. 37 is a cross-sectional view showing the manufacturing process following FIG. 36.

FIG. 35 to FIG. 37 shows a method of manufacturing the semiconductor device according to the seventh embodiment. FIG. 35 shows a state that the porous silicon layer 3 is selectively formed on the surface region of the silicon substrate 1 by anodization, like the above embodiments. The surface of the substrate is subjected to hydrogen annealing.

As illustrated in FIG. 36, silicon of the porous silicon layer 3 moved upwardly, and the silicon substrate 1 is formed with the hollow region 5 while the surface of the hollow region 5 is closed with the silicon.

Thereafter, the STI 8 is formed in the silicon substrate 1, as seen from FIG. 37. A MOS transistor and the like are formed in the element region surrounded by the STI 8 by normal manufacturing process.

The thickness of the hollow region 5 changes depending on the micro hole size of the porous silicon layer 3 formed first. The higher hole density is, the thicker the hollow region 5 is formed. The micro hole size of the porous silicon layer 3 is optimized in accordance with current and chemical solution in anodization. By doing so, the size of the hollow region 5 is controlled; as a result, the film thickness of the silicon layer 4 on the hollow region 5 can be reduced to a range impossible to normal formation.

In the seventh to ninth embodiments, the thin silicon layer having the thickness of 10 to 50 nm is formed. However, according to the method described above, anodization conditions are properly preset, and thereby, it is possible to form a thick silicon layer having a thickness of 50 nm or more.

FIG. 35 to FIG. 37 shows the method of manufacturing the semiconductor device according to the seventh embodiment. However, the foregoing method is also applicable to the eighth and ninth embodiments. More specifically, the number and position of the formed porous silicon layer 3 are changed, and thereby, it is possible to form the hollow region 5 shown in each of the eighth and ninth embodiments. In the eighth embodiment, the porous silicon layer 3 may be formed at the position corresponding to the body of the MOS transistor. In the ninth embodiment, the porous silicon layer 3 may be formed at the position corresponding to the body and the source/drain region of the MOS transistor, that is, over the entire element region.

The element region is formed with the NMOS transistor. The present invention is not limited to the NMOS transistor; in this case, a PMOS transistor and other semiconductor elements may be formed therein.

(Tenth Embodiment)

Figure 38:
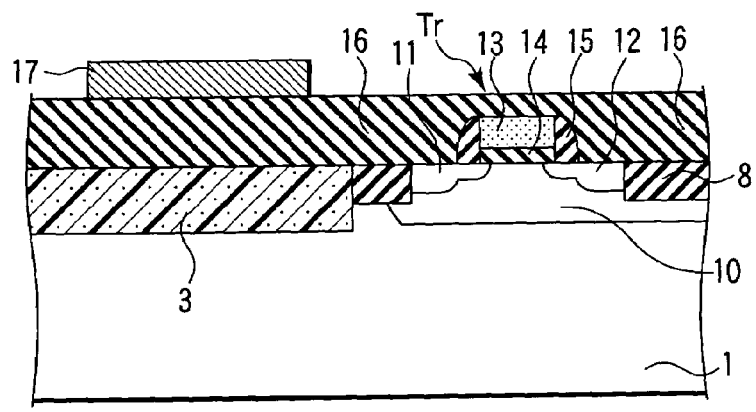
FIG. 38 is a cross-sectional view showing a semiconductor device according to a tenth embodiment of the present invention.

FIG. 38 shows a semiconductor device according to the tenth embodiment of the present invention. The tenth embodiment relates to a modification example of the fourth embodiment shown in FIG. 15. The porous silicon layer 3 is selectively formed in the silicon substrate 1. A spiral inductor 17 (plan view is not shown) is formed above the porous silicon layer via an interlayer insulating film 16. The silicon substrate 1 formed with no porous silicon layer 3 has the same structure as a normal bulk substrate. A NMOS transistor Tr is formed in the silicon substrate 1, for example.

Figure 39:
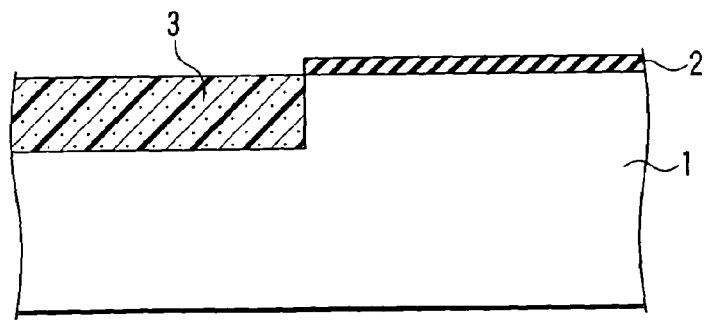
FIG. 39 is a cross-sectional view to explain a method of manufacturing the semiconductor device according to the tenth embodiment of the present invention.
Figure 40:
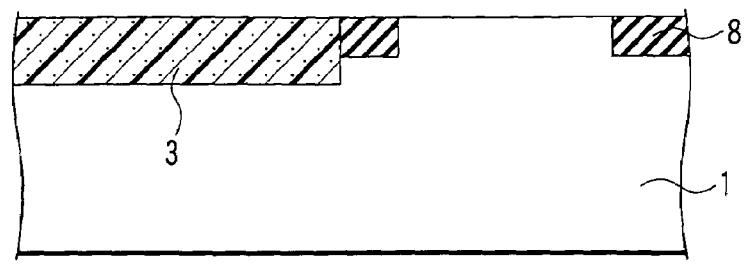
FIG. 40 is a cross-sectional view showing the manufacturing process following FIG. 39.

FIG. 39 and FIG. 40 show a method of manufacturing the semiconductor device according to the tenth embodiment.

As shown in FIG. 39, an insulating film 2 is selectively formed on the surface of the silicon substrate 1. The insulating film 2 is formed correspondingly to non-formation region of the porous silicon layer 3. For example, resist may be used as the insulating film 2. Thereafter, anodization is carried out with respect to the silicon substrate 1, as described before. By doing so, current flows through only portions having no insulating film 2, so that the porous silicon layer 3 can be selectively formed as shown in FIG. 39.

Thereafter, the insulating film 2 is removed so that the STI 8 can be formed in the silicon substrate, as illustrated in FIG. 40.

As seen from FIG. 38, the NMOS transistor Tr is formed in the element region surrounded by the STI 8. Thereafter, the interlayer insulating film 16 is formed on the entire surface. The inductor 17 is formed on the interlayer insulating film 16 corresponding to the porous silicon layer 3 by normal semiconductor process.

According to the tenth embodiment, the porous silicon layer 3 is formed below the spiral inductor 17. Thus, this serves to prevent the generation of eddy current in the silicon substrate 1. As a result, it is possible to improve the characteristic of the inductor 17.

(11th Embodiment)

Figure 41:
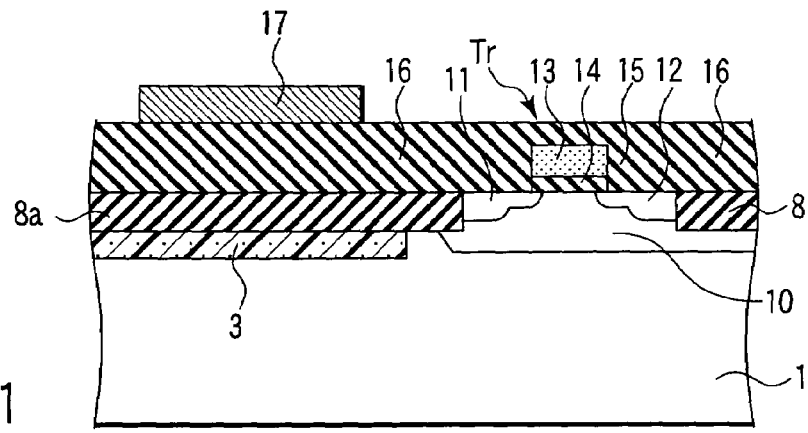
FIG. 41 is a cross-sectional view showing a semiconductor device according to an 11th embodiment of the present invention.

FIG. 41 shows a semiconductor device according to the 11th embodiment of the present invention. The 11th embodiment relates to a modification example of the tenth embodiment.

In FIG. 41, the porous silicon layer 3 is selectively formed in the silicon substrate 1. A buried oxide film 8*a* connected with the STI 8 is formed above the porous silicon layer 3. An interlayer insulating film 16 is formed on the element region surrounded by the STI 8 and the buried oxide film 8*a*. A spiral inductor 17 (plan view is not shown) is formed on the interlayer insulating film 16 corresponding to the porous silicon layer 3.

The portion formed with no porous silicon layer 3 has the same structure as a normal bulk substrate. For example, a NMOS transistor is formed in the element region surrounded by the STI 8.

Figure 42:
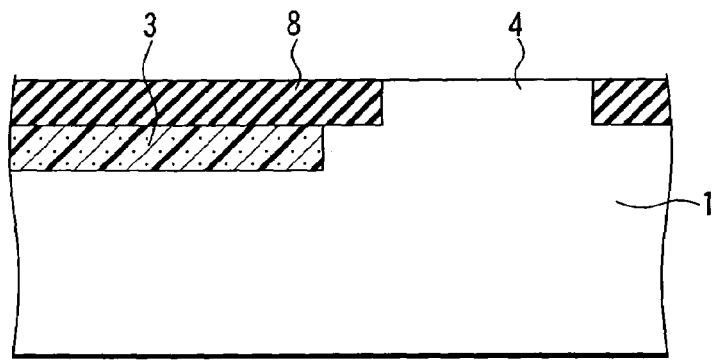
FIG. 42 is a cross-sectional view to explain a method of manufacturing the semiconductor device according to the 11th embodiment of the present invention.

FIG. 42 shows a method of manufacturing the semiconductor device according to the 11th embodiment. FIG. 42 shows a state after the manufacturing processes of FIG. 17 and FIG. 18 are carried out. More specifically, the porous silicon layer 3 is selectively formed in the silicon substrate 1. The silicon layer 4 is formed on the porous silicon layer 3 and the silicon substrate 1 by epitaxial growth. In the silicon substrate 1, normal STI process is carried out, and thereby, the normal bulk substrate is formed with the STI 8 while the buried oxide film 8*a* connected with the STI 8 is formed on the porous silicon layer 3. Thereafter, the NMOS transistor Tr and the inductor 17 are formed via the same process as the tenth embodiment.

According to the 11th embodiment, the buried oxide film 8*a* and the porous silicon layer 3 is formed below the spiral inductor 17. Thus, this serves to further prevent the generation of eddy current in the silicon substrate 1. As a result, it is possible to improve the characteristic of the inductor 17.

(12th Embodiment)

Figure 43:
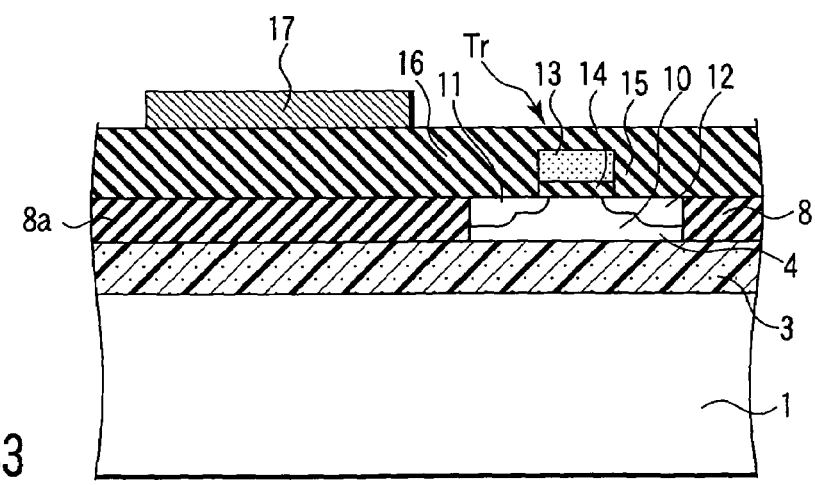
FIG. 43 is a cross-sectional view showing a semiconductor device according to a 12th embodiment of the present invention.

FIG. 43 shows a semiconductor device according to the 12th embodiment of the present invention. The 12th embodiment relates to a modification example of the 11th embodiment. In the 11th embodiment (FIG. 41), the porous silicon layer 3 is formed at only portion corresponding to the inductor 17. On the contrary, in the 12th embodiment, the porous silicon layer 3 is formed under the element region. Namely, in the element region, the porous silicon layer 3 is formed under the silicon layer 4. Thus, the NMOS transistor Tr of the element region is formed in SOI structure.

Figure 44:
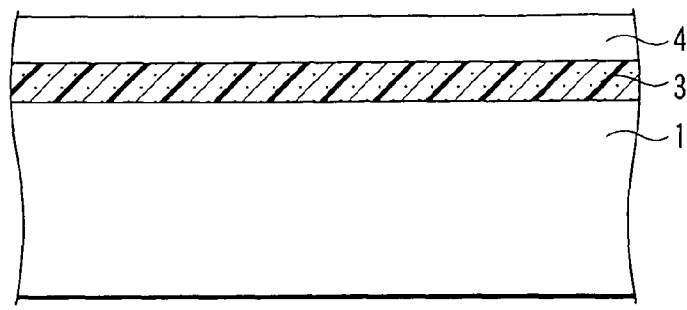
FIG. 44 is a cross-sectional view to explain a method of manufacturing the semiconductor device according to the 12th embodiment of the present invention.
Figure 45:
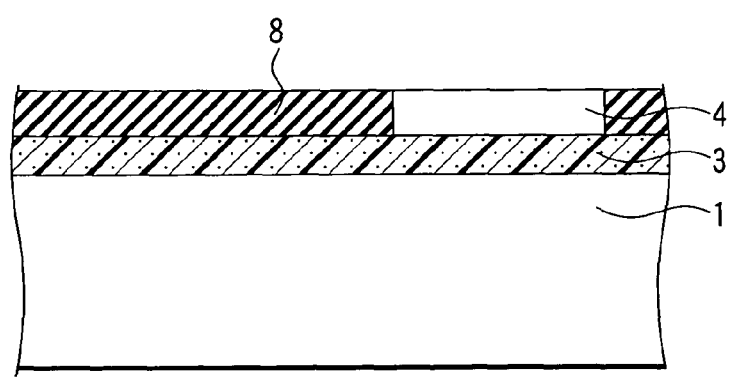
FIG. 45 is a cross-sectional view showing the manufacturing process following FIG. 44.

FIG. 44 and FIG. 45 show a method of manufacturing the semiconductor device according to the 12th embodiment.

FIG. 44 shows the following state. As described in FIG. 25, anodization is carried out with respect to the entire surface of the silicon substrate 1 so that the porous silicon layer 3 can be formed, and the silicon layer 4 is formed on the porous silicon layer 3 by epitaxial growth.

As depicted in FIG. 45, according to normal STI process, the element region (active region), that is, the silicon layer 4 is left while an oxide film is buried in other portions. In this manner, the STI 8 and the buried oxide film 8*a* connected with the STI 8 are formed. Then, the NMOS transistor is formed in the element region, and thereafter, an interlayer insulating film 16 is formed as seen from FIG. 43. Thereafter, a spiral inductor 17 is formed on the interlayer insulating film 16 corresponding to a so-called field.

According to the 12th embodiment, the porous silicon layer 3 is formed below the spiral inductor 17. Thus, this serves to prevent the generation of eddy current in the silicon substrate 1. As a result, it is possible to improve the characteristic of the inductor 17.

In addition, the element region is surrounded with the STI 8 and the porous silicon layer 3. Therefore, cross talk characteristic is improved.

In addition, the porous silicon layer 3 has metal gettering ability; therefore, device performance can be improved.

(13th Embodiment)

Figure 46:
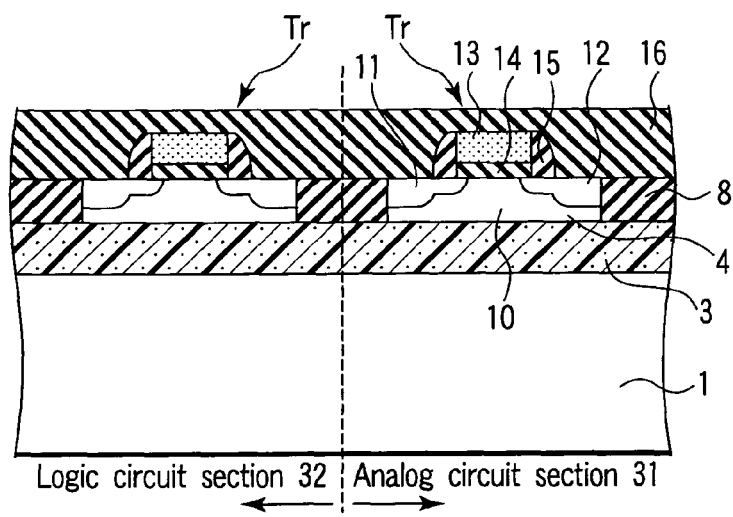
FIG. 46 is a cross-sectional view showing a semiconductor device according to a 13th embodiment of the present invention.

FIG. 46 shows a semiconductor device according to the 13th embodiment of the present invention. The 13th embodiment relates to a modification example of the 12th embodiment, that is, a device having the structure in which analog and digital circuits are embedded in chip. In FIG. 46, a NMOS transistor Tr is shown as the typical example of the analog circuit and a logic circuit as the digital circuit.

The porous silicon layer 3 is formed in the silicon substrate 1. The silicon layer 4 is formed on the porous silicon layer 3. The boundary between an analog circuit section 31 and a logic circuit section 32 is isolated via the STI 8.

Figure 47:
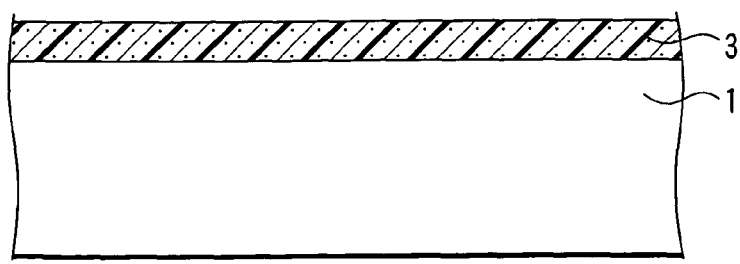
FIG. 47 is a cross-sectional view to explain a method of manufacturing the semiconductor device according to the 13th embodiment of the present invention.
Figure 48:
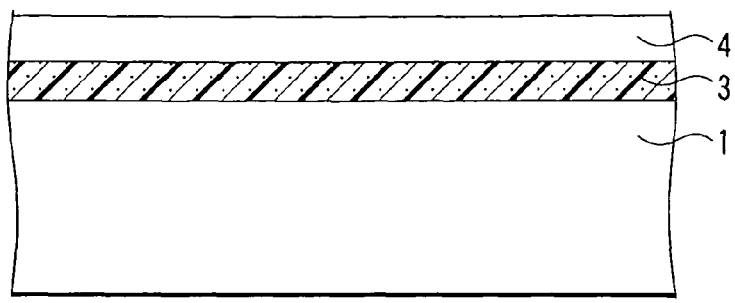
FIG. 48 is a cross-sectional view showing the manufacturing process following FIG. 47.
Figure 49:
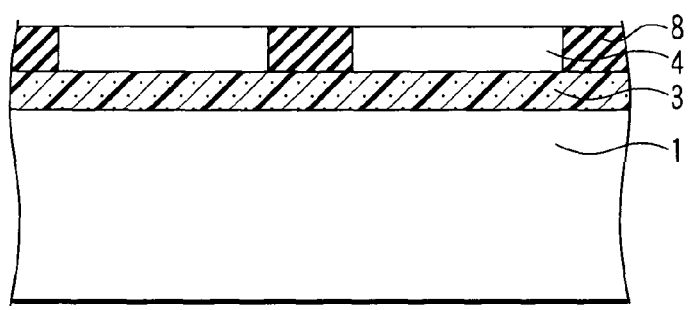
FIG. 49 is a cross-sectional view showing the manufacturing process following FIG. 48.

FIG. 47 to FIG. 49 shows a method of manufacturing the semiconductor device according to the 13th embodiment.

FIG. 47 shows a state that anodization is carried out with respect to the entire surface of the silicon substrate 1 so that the porous silicon layer 3 can be formed, in the same manner as described in FIG. 24.

FIG. 48 shows a state that the silicon layer 4 is formed on the porous silicon layer 3 by epitaxial growth.

As seen from FIG. 49, the STI 8 is formed in the silicon layer 4 according to normal STI process so that the analog circuit section 31 and the logic circuit section 32 is isolated.

Thereafter, the MOS transistor shown in FIG. 46 is formed in each element region of the analog circuit section 31 and the logic circuit section 32 according to normal semiconductor process.

According to the 13th embodiment, the analog circuit section 31 and the logic circuit section 32 individually have the structure surrounded by the STI 8 and the porous silicon layer 3. A great many of micro holes exists in the porous silicon layer 3; therefore, current is substantially hard to flow as compared with a single crystal silicon. Consequently, it is possible to improve cross talk characteristic from the logic circuit section 32 to the analog circuit section 31.

(14th Embodiment)

Figure 50:
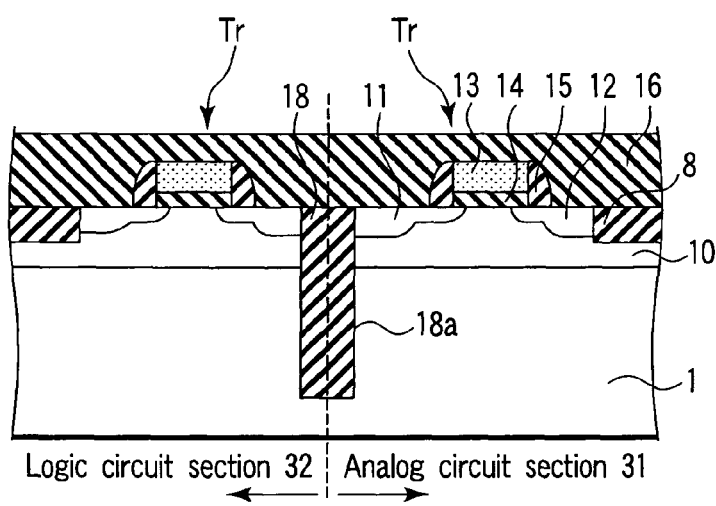
FIG. 50 is a cross-sectional view showing a semiconductor device according to a 14th embodiment of the present invention.

FIG. 50 shows a semiconductor device according to the 14th embodiment of the present invention. The 14th embodiment relates to a modification example of the 13th embodiment.

In FIG. 50, a NMOS transistor Tr is shown as the typical example of the analog circuit and a logic circuit as the logic circuit as the digital circuit. The boundary between the analog circuit section 31 formed with the analog circuit and the logic circuit section 32 formed with the logic circuit is formed with a buried oxide film 18 having a length longer than the STI 8. More specifically, the boundary between the analog circuit 31 and the logic circuit 32 is formed with a trench 18a deeper than the STI 8, and the buried oxide film 18 is formed in the trench 18a. The analog circuit section 31 and the logic circuit section 32 are isolated from each other via the buried oxide film 18.

Figure 51:
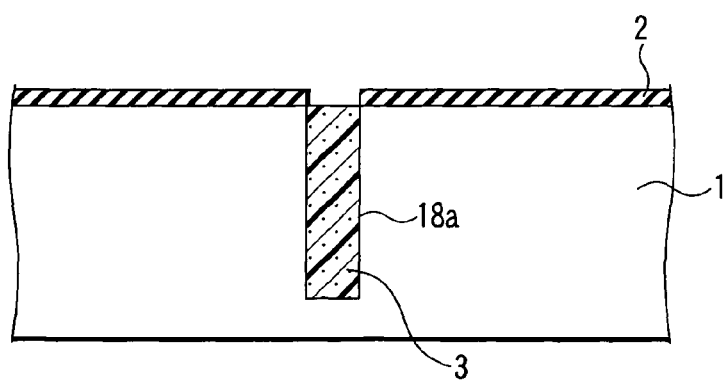
FIG. 51 is a cross-sectional view to explain a method of manufacturing the semiconductor device according to the 14th embodiment of the present invention.
Figure 52:
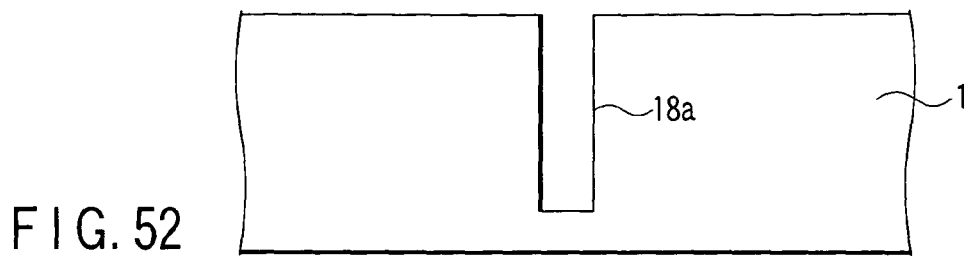
FIG. 52 is a cross-sectional view showing the manufacturing process following FIG. 51.
Figure 53:
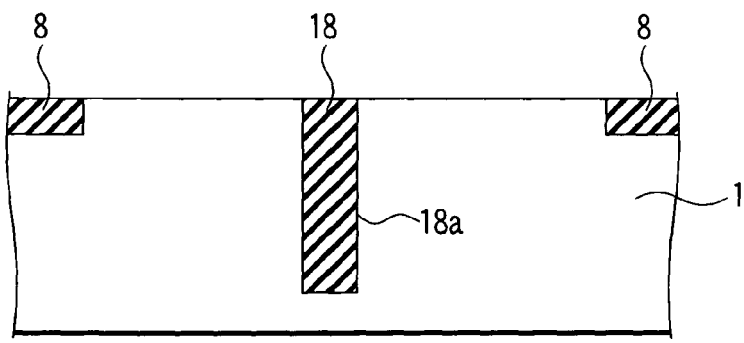
FIG. 53 is a cross-sectional view showing the manufacturing process following FIG. 52.

FIG. 51 to FIG. 53 shows a method of manufacturing the semiconductor device according to the 14th embodiment.

As illustrated in FIG. 51, an insulating film 2 is formed as a mask on the silicon substrate 1. The insulating film 2 has an opening corresponding to the deeper trench 18a. Anodization is carried out with respect to the silicon substrate 1 using the insulating film 2 as the mask, and thereby, a deeper porous silicon layer 3 is formed. Thereafter, the silicon substrate 1 is etched by HF solution.

By doing so, the deeper trench 18a shown in FIG. 52 is formed. The trench 18a is filled with the buried oxide film 18 so that the surface can be planarized. The buried oxide film 18 is formed using CVD and CMP.

As shown in FIG. 53, after the buried oxide film 18 is formed, necessary regions on the silicon substrate 1 are formed with the STI 8 by normal STI process. Thereafter, both logic circuit and analog circuit are formed according to normal semiconductor process.

According to the 14th embodiment, the analog circuit section 31 and the logic circuit section 32 are isolated from each other via the trench 18a deeper than the STI 8. Therefore, it is possible to improve cross talk characteristic between the analog circuit section 31 and the logic circuit section 32.

The deeper trench 18a is formed in a manner of forming the deeper porous silicon layer 3 in the silicon substrate 1 by anodization, and etching it. According to the anodization, damage to the substrate is reduced as compared with RIE; therefore, it is effective in improvement of cross talk characteristic between the analog circuit section 31 and the logic circuit section 32.

(15th Embodiment)

Figure 54:
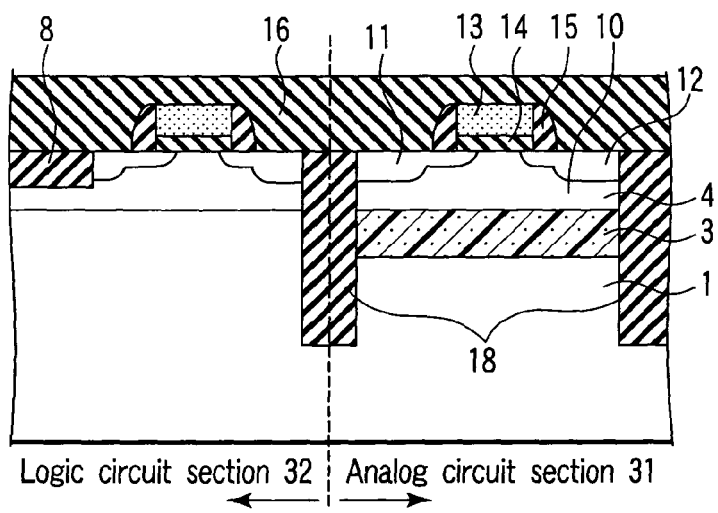
FIG. 54 is a cross-sectional view showing a semiconductor device according to a 15th embodiment of the present invention.

FIG. 54 shows a semiconductor device according to the 15th embodiment of the present invention. The 15th embodiment relates to a modification example of the 14th embodiment.

In FIG. 54, the analog circuit section 31 has the SOI structure; on the other hand, the logic circuit section has the bulk structure. More specifically, in the analog circuit section 31, the porous silicon layer 3 is formed in the silicon substrate 1. The silicon layer 4 is formed on the porous silicon layer 3, and source/drain regions 11 and 12 of the NMOS transistor Tr constituting the analog circuit is formed in the silicon layer 4.

In the logic circuit section 32 having no porous silicon layer 3, the silicon layer 4 is formed on the surface region of the silicon substrate 1. Source/drain regions 11 and 12 of the NMOS transistor Tr constituting the logic circuit is formed in the silicon layer 4.

The boundary between the analog circuit section 31 and the logic circuit section 32 is formed with the deeper trench 18a, and the trench 18a is filled with the buried oxide film 18. The porous silicon layer 3 is formed contacting with the deeper trench 18a. Namely, the analog circuit is surrounded by the deeper trench 18a and the porous silicon layer 3, and isolated from the logic circuit.

Figure 55:
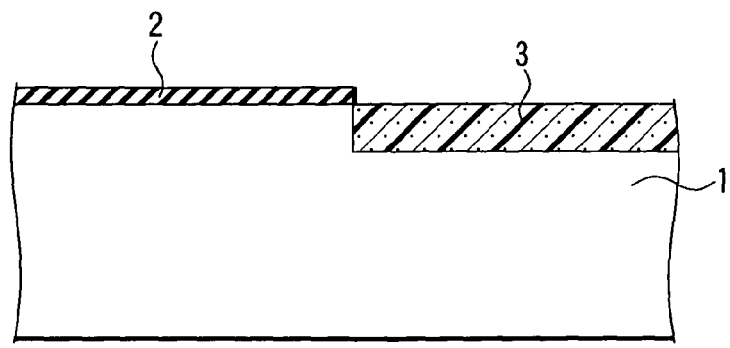
FIG. 55 is a cross-sectional view to explain a method of manufacturing the semiconductor device according to the 15th embodiment of the present invention.
Figure 56:
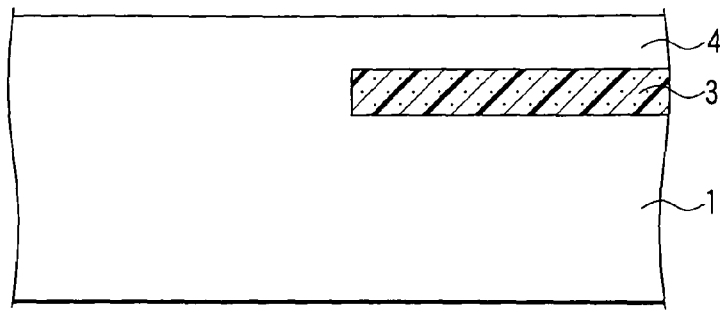
FIG. 56 is a cross-sectional view showing the manufacturing process following FIG. 55.
Figure 57:
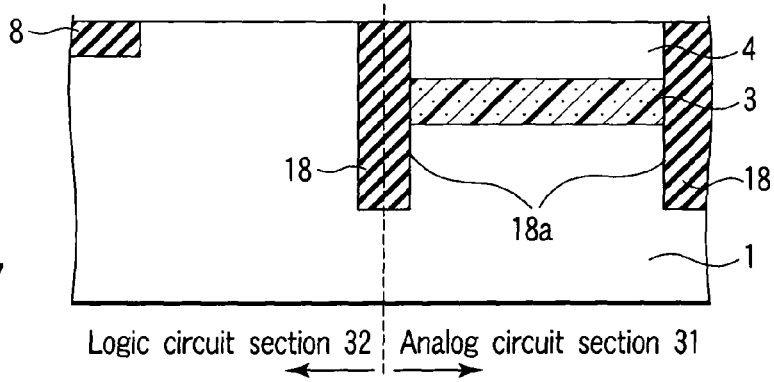
FIG. 57 is a cross-sectional view showing the manufacturing process following FIG. 56.

FIG. 55 to FIG. 57 shows a method of manufacturing the semiconductor device according to the 15th embodiment.

As shown in FIG. 55, an insulating film 2 corresponding to the logic circuit section 32 is formed on the silicon substrate 1. Anodization is carried out with respect to the silicon substrate 1 using the insulating film 2 as a mask. By doing so, the porous silicon layer 3 is formed on the surface of the silicon substrate corresponding to the analog circuit section 31.

As illustrated in FIG. 56, the insulating film 2 is removed, and thereafter, the silicon layer 4 is formed on the silicon substrate 1 and the porous silicon layer 3 by epitaxial growth.

As depicted in FIG. 57, a deep trench 18a is formed in the silicon substrate 1. The trench 18a is formed to surround the silicon layer 4 and the porous silicon layer 3, which are used as the analog circuit section 31. In order to form the trench 18a, the same method as the 14th embodiment may be employed. Namely, the porous silicon layer is formed by anodization, and the porous silicon layer is removed by etching. The trench 18a may be formed by RIE. The trench 18a is filled with a buried oxide film 18. According to normal STI process, necessary regions in the silicon substrate 1 are formed with the STI 8.

If a trench capacitor (not shown) exists in the logic circuit section 32, the deep trench 18a may be formed at the same time of the formation of the trench capacitor. RIE or anodization and etching may be employed to form the trench. Thereafter, the logic circuit section 32 and the analog circuit section 31 are formed with circuit elements by normal semiconductor process.

According to the 15th embodiment, the analog circuit section 31 is surrounded with the deep trench 18 and the porous silicon layer 3 so that it can be isolated from the logic circuit section 32. Therefore, it is possible to further improve cross talk characteristic between the analog circuit section 31 and the logic circuit section 32.

(16th Embodiment)

Figure 58:
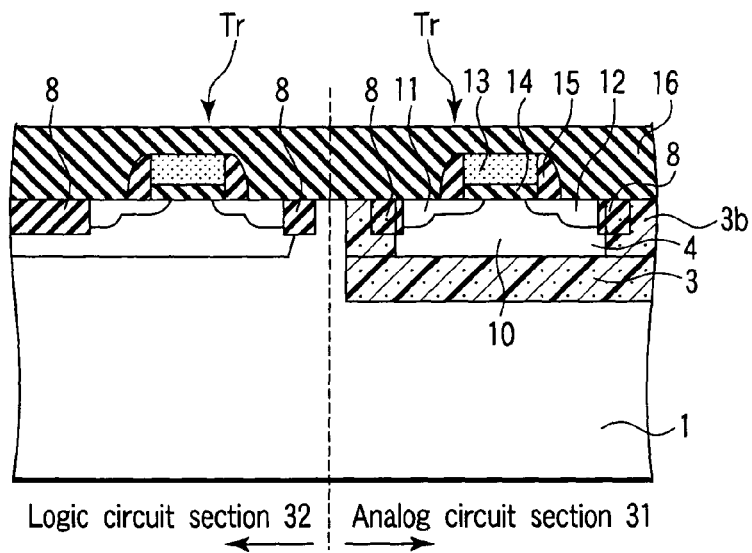
FIG. 58 is a cross-sectional view showing a semiconductor device according to a 16th embodiment of the present invention.

FIG. 58 shows a semiconductor device according to the 16th embodiment of the present invention. The 16th embodiment relates to a modification example of the 15th embodiment.

In FIG. 58, the porous silicon layer 3 is formed in the silicon substrate 1 corresponding to the analog circuit section 31. The silicon layer 4 is formed on the porous silicon layer 3. The STI 8 is formed in the silicon layer 4, and a NMOS transistor Tr constituting the analog circuit is formed in the region surrounded by the STI 8. In the logic circuit section 32 having no porous silicon layer 3, the STI 8 is formed in the silicon substrate 1 while a NMOS transistor Tr constituting the logic circuit is formed in the region surrounded by the STI 8.

In the analog circuit section 31, another porous silicon layer 3*b* is formed on the porous silicon layer 3 outside the STI 8. Thus, the analog circuit is surrounded with the porous silicon layers 3 and 3*b*.

Figure 59:
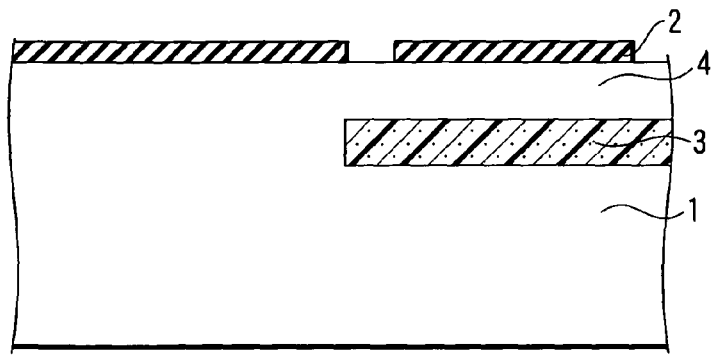
FIG. 59 is a cross-sectional view to explain a method of manufacturing the semiconductor device according to the 16th embodiment of the present invention.
Figure 60:
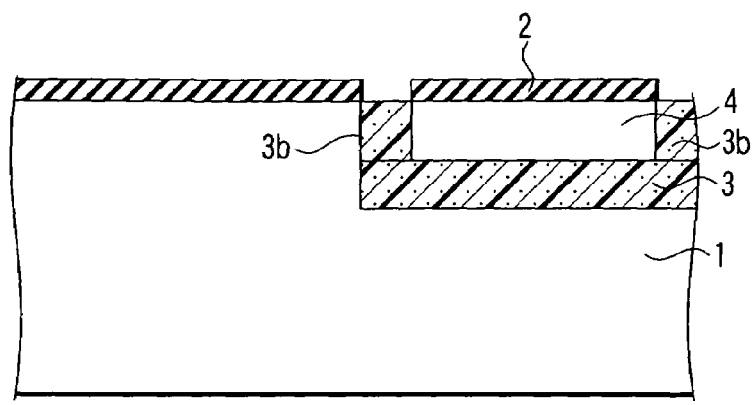
FIG. 60 is a cross-sectional view showing the manufacturing process following FIG. 59.
Figure 61:
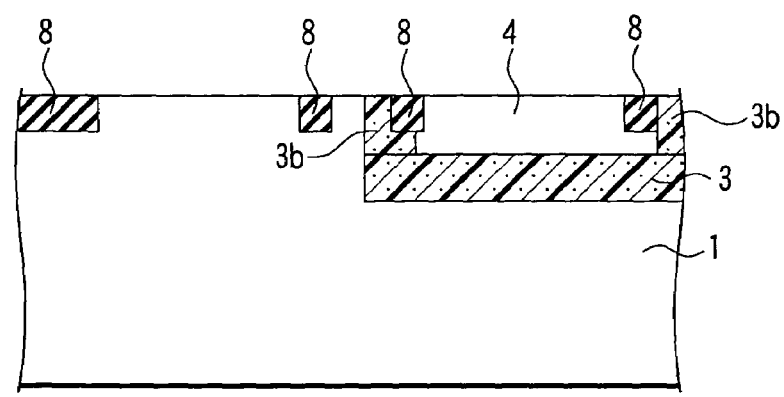
FIG. 61 is a cross-sectional view showing the manufacturing process following FIG. 60.

FIG. 59 to FIG. 61 shows a method of manufacturing the semiconductor device according to the 16th embodiment.

FIG. 59 shows a state that an insulating film 2 is selectively formed on the structure shown in FIG. 56. The insulating film 2 is formed with openings patterned to surround the analog circuit section. Thereafter, anodization is carried out with respect to the silicon substrate 1.

FIG. 60 shows a state that a porous silicon layer 3*b* is formed in the silicon substrate 1 by anodization. The porous silicon layer 3 is formed at the peripheral edge portion on the porous silicon layer 3.

Thereafter, according to normal STI process, necessary regions in the silicon substrate 1 are formed with the STI 8, as seen from FIG. 61. The logic circuit section 32 and the analog circuit section 31 are formed with circuit elements by normal semiconductor process.

According to the 16th embodiment, the analog circuit is surrounded with porous silicon layers 3 and 3*b* so that the porous silicon layers 3 and 3*b* can isolate the analog circuit section 31 and the logic circuit section 32. Therefore, it is possible to further enhance cross talk characteristic.

(17th Embodiment)

Figure 62:
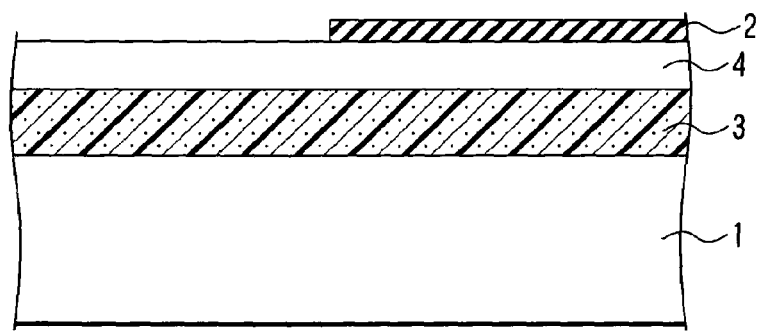
FIG. 62 is a cross-sectional view to explain a method of manufacturing a semiconductor device according to a 17th embodiment of the present invention.

FIG. 62 shows a semiconductor device according to the 17th embodiment of the present invention. The 17th embodiment relates to a method of manufacturing a partial SOI substrate using porous silicon layer.

As shown in FIG. 62, the porous silicon layer 3 is formed on the silicon substrate 1 by anodization, and the silicon layer 4 is formed on the porous silicon layer 3 by epitaxial growth. An insulating film 2 is selectively formed on the silicon layer 4. The insulating film 2 is formed at the portion corresponding to a SOI region while being not formed at other portions. A resist film may be used as the insulating film 2.

Figure 63:
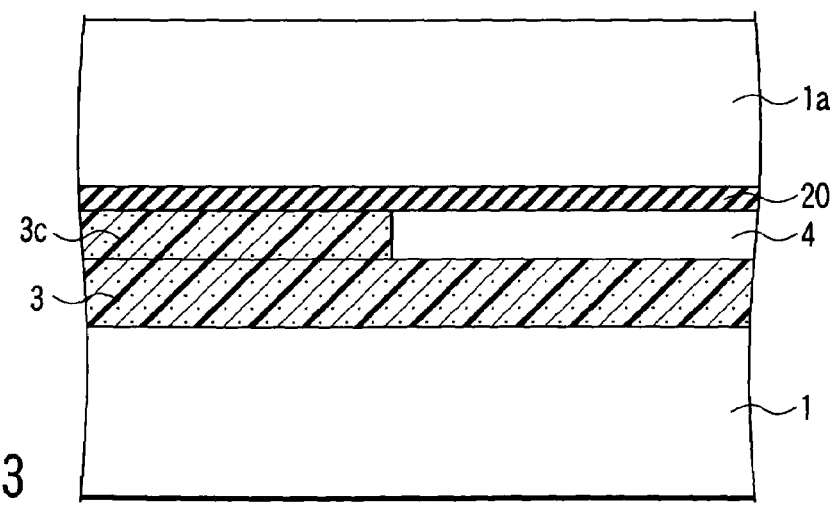
FIG. 63 is a cross-sectional view showing the manufacturing process following FIG. 62.

As illustrated in FIG. 63, anodization is carried out with respect to the silicon substrate 1. By doing so, another porous silicon layer 3*c* contacting with the porous silicon layer 3 is formed in the exposed silicon layer 4. Thereafter, the insulating film 2 is removed, and an insulating film 20 used as the buried insulating film is formed on the porous silicon layer 3*c* and the silicon layer 4.

A silicon substrate 1*a* used as support substrate is bonded onto the insulating film 20. Thereafter, the porous silicon layers 3 and 3*c* are removed by water jet process so that the silicon substrate 1 as seed substrate can be peeled.

Figure 64:
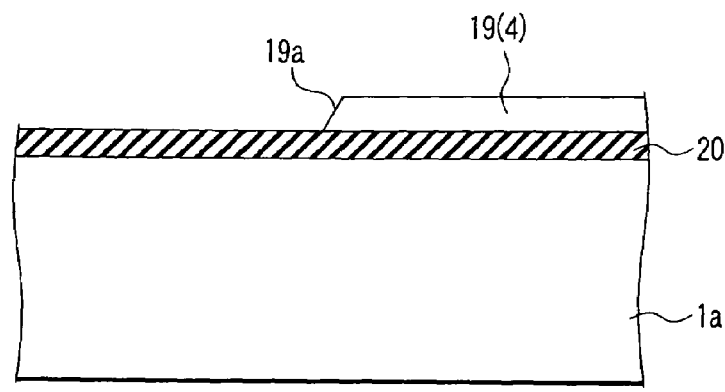
FIG. 64 is a cross-sectional view showing the manufacturing process following FIG. 63.

FIG. 64 shows a state of turning over the substrate after the silicon substrate 1 as seed substrate is peeled. After the silicon substrate 1 is peeled, heat treatment, for example, high-temperature hydrogen annealing is carried out, and thereby, the side of a SOI layer 19 (original silicon layer 4) is formed with a forward taper portion 19*a* gently sloping. Namely, the forward tapered portion 19*a* is formed so that the side of the SOI layer 19 is inclined from the bottom toward the upper portion, that is, to the SOI layer 19.

Figure 65:
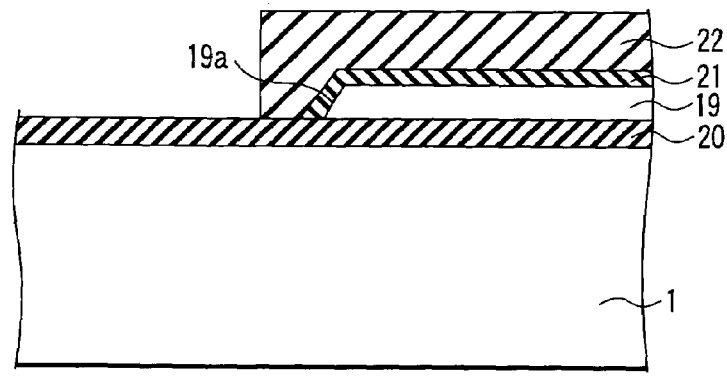
FIG. 65 is a cross-sectional view showing the manufacturing process following FIG. 64.

As shown in FIG. 65, the silicon substrate 1 is lightly oxidized, and thereby, an oxide film 21 is formed on the surface of the SOI layer 19. A resist film is formed on the entire surface of the silicon substrate 1*a*. The resist film is patterned so that the SOI layer 19 and the oxide film 21 can be coated with a resist film 22. In this case, the resist film 22 is provided with slight margin outside the lower end of the forward taper portion 19*a* of the SOI film 19.

Figure 66:
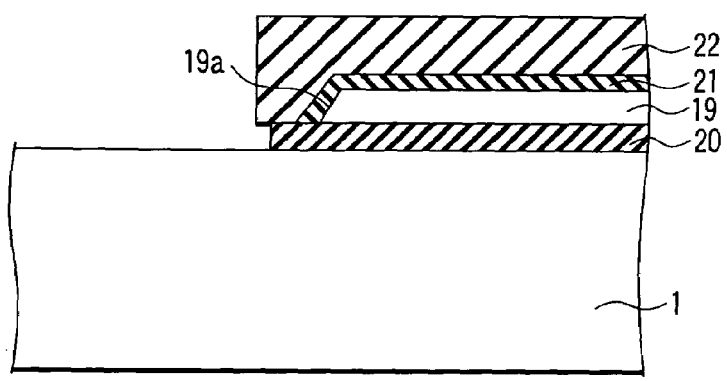
FIG. 66 is a cross-sectional view showing the manufacturing process following FIG. 65.

As illustrated in FIG. 66, the insulating film 20 is etched using the resist film 22 as a mask.

Figure 67:
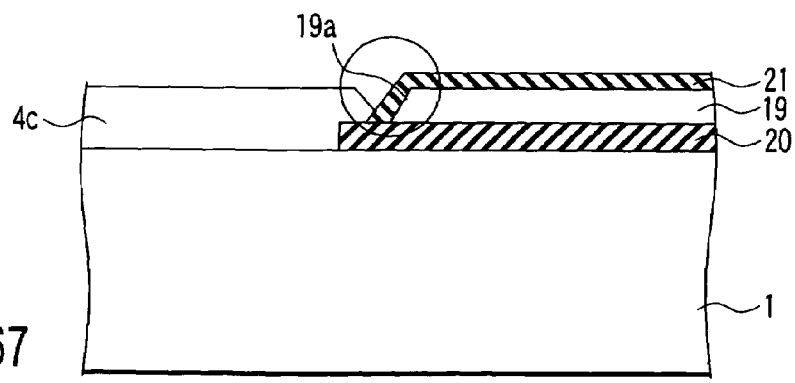
FIG. 67 is a cross-sectional view showing the manufacturing process following FIG. 66.

As depicted in FIG. 67, the resist film 22 is removed, and pre-treatment is carried out so that a silicon layer 4*c* is formed on the support substrate 1*a* by epitaxial growth.

According to the 17th embodiment, the end portion of the SOI layer before epitaxial growth is formed with the forward taper portion 19*a*. Therefore, there is no generation of abnormal shape in the boundary (portion shown by a broken line) between the silicon layer 4 and the oxide film 21 after epitaxial growth. This serves to prevent trouble from taking place in the later semiconductor process.

(18th Embodiment)

FIG. 68 to FIG. 71 shows the 18th embodiment of the present invention, that is, another method of manufacturing the partial SOI substrate.

Figure 68:
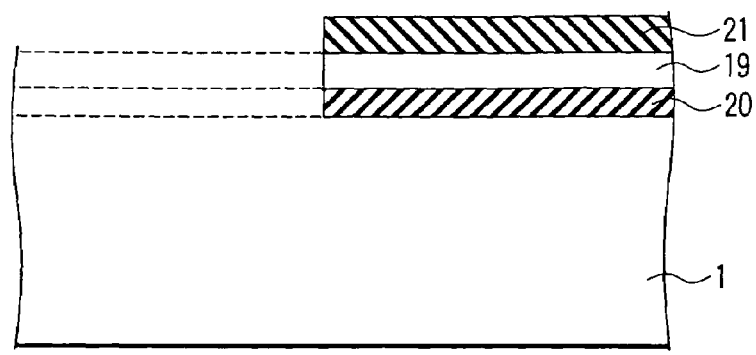
FIG. 68 is a cross-sectional view to explain a method of manufacturing a semiconductor device according to an 18th embodiment of the present invention.

As shown in FIG. 68, a buried insulating film 20 and a SOI layer 19 are successively formed on the silicon substrate 1. A mask material 21 is formed on part of the SOI layer 19. The SOI layer 19 and the buried insulating film 20 are etched using the mask material as a mask. In FIG. 68, a broken line denotes the portion removed by etching.

Thereafter, a silicon layer is formed on the silicon substrate 1 by epitaxial growth.

Figure 69:
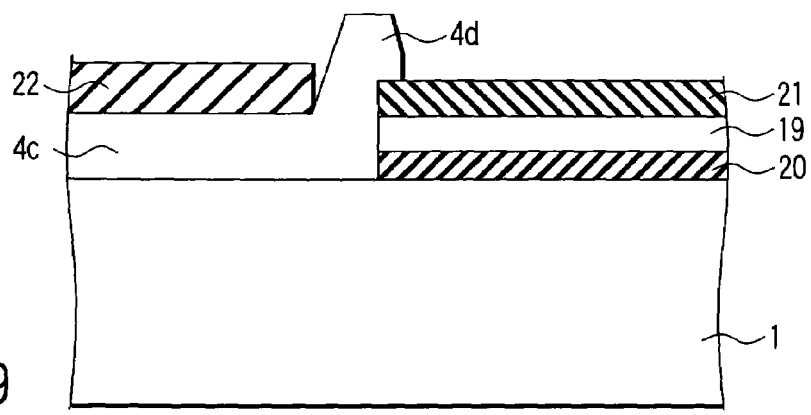
FIG. 69 is a cross-sectional view showing the manufacturing process following FIG. 68.

As seen from FIG. 69, the silicon layer 4*c* is formed with an abnormal shape portion 4*d* in the boundary between the silicon layer 4 and the SOI layer 19 and between the buried insulating film 20 and the mask material 21. If the later semiconductor process is carried out in a state that the abnormal shape portion 4*d* is left, there is a possibility that trouble takes place. In view of the above-mentioned disadvantage, a second mask material 22 comprising insulating film is formed on the silicon layer 4*c*. The second mask material 22 may be formed on the first mask material 21 so long as the abnormal shape portion 4*d* is exposed.

Figure 70:
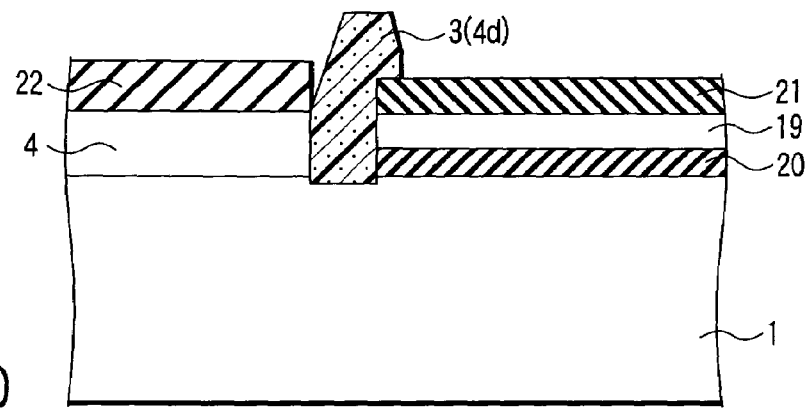
FIG. 70 is a cross-sectional view showing the manufacturing process following FIG. 69.

When anodization is carried out in this state, current flows through only exposed abnormal shape portion 4*d*, so that only abnormal shape portion 4*d* is formed with porous silicon layer 3, as seen from FIG. 70.

Figure 71:
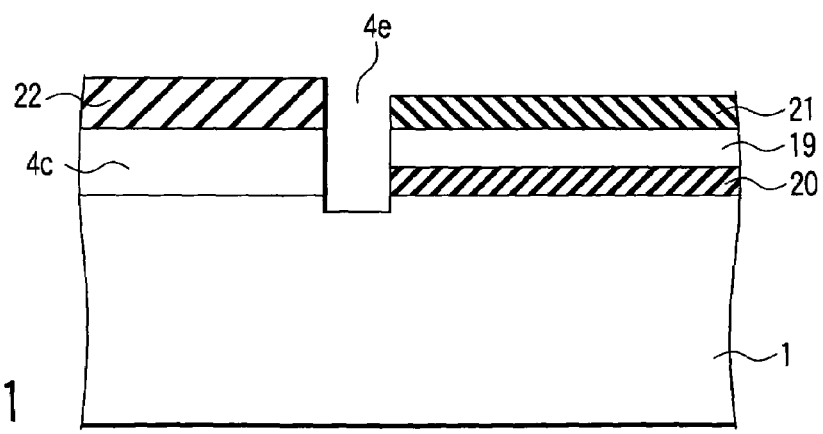
FIG. 71 is a cross-sectional view showing the manufacturing process following FIG. 70.

As depicted in FIG. 71, only porous silicon layer 3 is selectively etched according to the method described above, and thereby, the abnormal shape portion 4*d* is removed. A recess 4*e* formed by removing the abnormal shape portion 4*d* is filled with an oxide film, and thereafter, the oxide film is planarized.

According to the 18th embodiment, only abnormal shape portion 4d generated in the boundary between SOI and bulk regions is formed with the porous silicon layer by anodization. Thus, the abnormal shape portion 4d is readily removed. Consequently, the partial SOI substrate having a flat surface is formed, so that trouble can be prevented from taking place in the later process.

In some embodiments, the NMOS transistor is give as the typical example of the circuit element. The present invention is not limited to the embodiments; in this case, a PMOS transistor and other circuits may be used.

One of the embodiments (that is, 14th embodiment) shows the method of etching the porous silicon layer and filling the formed deep trench with the insulating film, in order to form the isolation trench. However, the porous silicon layer is left without being etched, and thereafter, it may be used as isolation material. In this case, it is possible to form a shallow trench in addition to the deep isolation trench using the porous silicon layer. This is applicable to other embodiments without being limited to the 14th embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon layer formed on the surface of a silicon substrate;
   a source/drain region of a MOS transistor formed in the silicon layer and a body in contact with the source/drain region;
   a silicon pillar formed in the silicon substrate under the body;
   a hollow region formed in the silicon substrate under the source/drain region; and
   a buried layer formed in the silicon layer, the buried layer being located on the hollow region and being in contact with the source/drain region.

2. The device according to claim 1, further comprising:
   a gate insulating film formed on the silicon layer corresponding to the body; and
   a gate electrode formed on the gate insulating film.

3. The device according to claim 1, wherein the buried layer is configured by an insulating film.

4. The device according to claim 1, wherein the silicon pillar is configured by a single crystal silicon.

* * * * *